(12) United States Patent
Illek et al.

(10) Patent No.: US 8,476,644 B2
(45) Date of Patent: Jul. 2, 2013

(54) OPTOELECTRONIC COMPONENT AND METHOD FOR THE MANUFACTURE OF A PLURALITY OF OPTOELECTRONIC COMPONENTS

(75) Inventors: Stefan Illek, Donaustauf (DE); Andreas Ploessl, Regensburg (DE); Alexander Heindl, Abensberg (DE); Patrick Rode, Regensburg (DE); Dieter Eissler, Nittendorf/Etterzhausen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 261 days.

(21) Appl. No.: 12/597,682

(22) PCT Filed: Apr. 25, 2008

(86) PCT No.: PCT/DE2008/000704
§ 371 (c)(1),
(2), (4) Date: Dec. 15, 2009

(87) PCT Pub. No.: WO2008/131736
PCT Pub. Date: Nov. 6, 2008

(65) Prior Publication Data
US 2010/0117111 A1    May 13, 2010

(30) Foreign Application Priority Data

Apr. 26, 2007  (DE) .................... 10 2007 019 776

(51) Int. Cl.
*H01L 27/15* (2006.01)
*H01L 33/00* (2010.01)
*H01L 21/00* (2006.01)

(52) U.S. Cl.
USPC .......... 257/79; 257/98; 257/99; 257/E33.001; 438/22; 438/25; 438/26; 438/27; 438/29

(58) Field of Classification Search
USPC .................. 257/98, 99, 79, E33.001; 438/22, 438/25, 26, 27, 29
See application file for complete search history.

(56) References Cited

U.S. PATENT DOCUMENTS

| | | |
|---|---|---|
| 3,974,514 A | 8/1976 | Kressel et al. |
| 5,003,359 A | 3/1991 | Abeles |
| 5,779,924 A | 7/1998 | Krames et al. |
| 6,018,167 A | 1/2000 | Oota |
| 6,066,861 A | 5/2000 | Höhn et al. |
| 6,518,079 B2 | 2/2003 | Imler |
| 6,730,940 B1 | 5/2004 | Steranka et al. |
| 6,775,310 B2 | 8/2004 | Sai et al. |

(Continued)

FOREIGN PATENT DOCUMENTS

| | | |
|---|---|---|
| CN | 1262528 A | 8/2000 |
| CN | 1619849 A | 5/2005 |

(Continued)

*Primary Examiner* — Long Tran
(74) *Attorney, Agent, or Firm* — Slater & Matsil, L.L.P.

(57) ABSTRACT

An optoelectronic component with a semiconductor body includes an active region suitable for generating radiation, and two electrical contacts arranged on the semiconductor body. The contacts are electrically connected to the active region. The contacts each have a connecting face that faces away from the semiconductor body. The contact faces are located on a connection side of the component and a side of the component that is different from the connection side is mirror-coated. A method for the manufacture of multiple components of this sort is also disclosed.

13 Claims, 10 Drawing Sheets

U.S. PATENT DOCUMENTS

| | | |
|---|---|---|
| 6,828,596 B2 | 12/2004 | Steigerwald et al. |
| 6,956,245 B2 | 10/2005 | Senda et al. |
| 6,960,485 B2 | 11/2005 | Uemura et al. |
| 6,969,946 B2 | 11/2005 | Steranka et al. |
| 7,080,932 B2 | 7/2006 | Keuper |
| 7,095,061 B2 | 8/2006 | Steigerwald et al. |
| 7,446,341 B2 | 11/2008 | Bader et al. |
| 7,592,194 B2 | 9/2009 | Jonda et al. |
| 2003/0015713 A1 | 1/2003 | Yoo |
| 2003/0151058 A1 | 8/2003 | Uemura et al. |
| 2003/0222259 A1* | 12/2003 | Senda et al. .................... 257/13 |
| 2003/0230754 A1 | 12/2003 | Steigerwald et al. |
| 2004/0065886 A1 | 4/2004 | Eliashevich et al. |
| 2004/0077114 A1 | 4/2004 | Coman et al. |
| 2004/0079942 A1 | 4/2004 | Steranka et al. |
| 2004/0232439 A1 | 11/2004 | Gibb et al. |
| 2005/0017250 A1 | 1/2005 | Nitta et al. |
| 2005/0056855 A1 | 3/2005 | Lin et al. |
| 2005/0067624 A1 | 3/2005 | Steigerwald et al. |
| 2005/0110032 A1 | 5/2005 | Saito et al. |
| 2006/0081858 A1 | 4/2006 | Lin et al. |
| 2006/0108593 A1 | 5/2006 | Kim et al. |
| 2006/0273339 A1 | 12/2006 | Steigerwald et al. |
| 2006/0278886 A1* | 12/2006 | Tomoda et al. ................. 257/99 |
| 2007/0069228 A1 | 3/2007 | Miller et al. |
| 2007/0284600 A1 | 12/2007 | Shchekin et al. |
| 2008/0029761 A1 | 2/2008 | Peng |
| 2009/0065800 A1 | 3/2009 | Wirth et al. |

FOREIGN PATENT DOCUMENTS

| | | |
|---|---|---|
| CN | 1846317 A | 10/2006 |
| CN | 1905224 A | 1/2007 |
| CN | 1922733 A | 2/2007 |
| DE | 197 09 228 A1 | 9/1997 |
| DE | 197 57 850 A1 | 7/1998 |
| DE | 102 44 986 A1 | 4/2004 |
| DE | 102 57 664 A1 | 7/2004 |
| DE | 103 39 982 A1 | 4/2005 |
| DE | 10 2004 012 219 A1 | 6/2005 |
| DE | 10 2005 007 601 A1 | 9/2005 |
| DE | 10 2004 037 868 A1 | 11/2005 |
| EP | 0 977 277 A1 | 2/2000 |
| EP | 1 220 336 A2 | 7/2002 |
| EP | 1 367 656 A2 | 12/2003 |
| EP | 1 416 545 A2 | 5/2004 |
| EP | 1 569 283 A1 | 8/2005 |
| JP | 57-092881 A | 6/1982 |
| JP | 2003-017757 A | 1/2003 |
| JP | 2004-047504 A | 2/2004 |
| JP | 2004-311677 A | 11/2004 |
| JP | 2005-005345 A | 1/2005 |
| JP | 2007-95821 A | 4/2007 |
| JP | 2008-004948 A | 1/2008 |
| TW | 437106 B | 5/2001 |
| WO | WO 98/12757 | 3/1998 |
| WO | WO 2005/081319 A1 | 9/2005 |
| WO | WO 2006/082687 A1 | 8/2006 |
| WO | WO 2007/032546 A1 | 3/2007 |

* cited by examiner

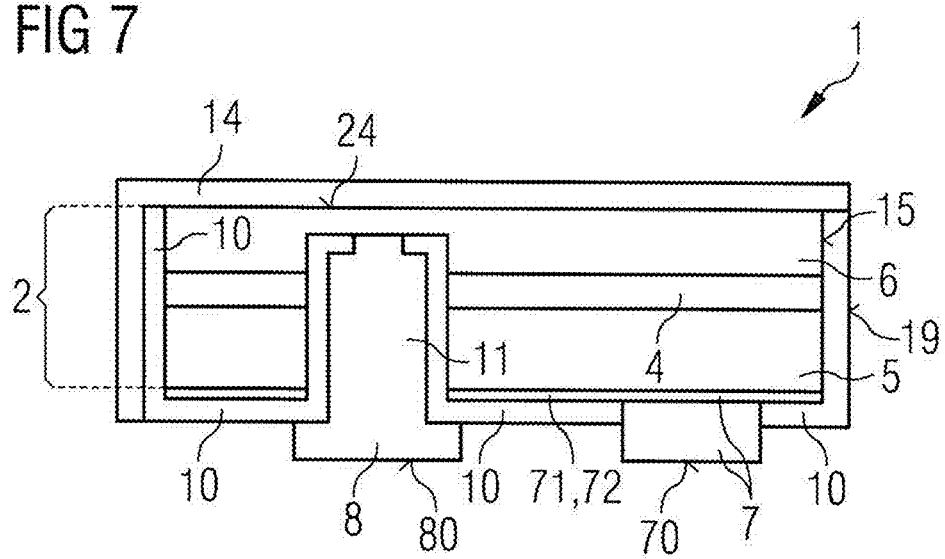
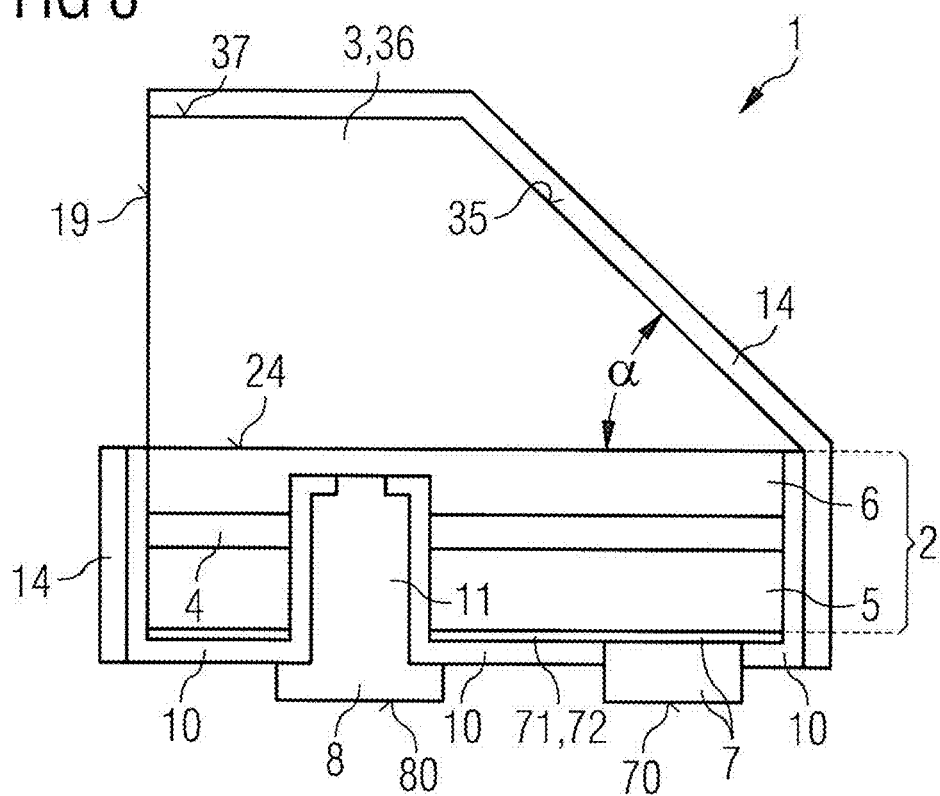

OPTOELECTRONIC COMPONENT AND METHOD FOR THE MANUFACTURE OF A PLURALITY OF OPTOELECTRONIC COMPONENTS

This patent application is a national phase filing under section 371 of PCT/DE2008/000704, filed Apr. 25, 2008, which claims the priority of German patent application 10 2007 019 776.6, filed Apr. 26, 2007, each of which is incorporated herein by reference in its entirety.

BACKGROUND

The present invention concerns an optoelectronic component, in particular, an optoelectronic component suitable for the generation of radiation, and a method for the manufacture of a plurality of such components.

SUMMARY

In one aspect, the present invention discloses an optoelectronic component with a high radiant exitance that can be manufactured in a simplified way. A cost effective manufacturing method for the manufacture of components of this type should also be disclosed.

The radiant exitance here refers to the radiation power emitted by the component when it is operated in W per m2 of the component's output face from which the radiation with this radiation power emerges.

An optoelectronic component in accordance with the invention comprises a semiconductor body that has an active region suitable for radiation generation and at least two electrical contacts arranged on the semiconductor body. The contacts are electrically conductively connected to the active region, and each of the contacts has a connecting face that faces away from the semiconductor body. The connecting faces are located on a connection side, in particular, a common connection side, of the component, and a side of the component, other than the connection side, is mirror-coated.

The semiconductor body preferably comprises a sequence of semiconductor layers that comprises the active region. The sequence of semiconductor layers may form the semiconductor body and may, in particular, be grown epitaxially.

The mirror-coated side of the component is expediently reflective for the radiation that is to be generated in the active region. Radiation that reaches the mirror-coated side of the component will be reflected back into the component owing to the mirror coating. By means of the mirror coating, radiation that would emerge from the component if the mirror coating were absent from this side can be diverted to one or a plurality of output faces of the component. Emergence of radiation from the component through the mirror-coated side is thus reduced or entirely avoided. As a result, the radiation power emitted from the output surface(s) is increased and the radiant exitance from the output surface is also increased correspondingly.

A reflectivity of the mirror coating for the radiation that is to be generated in the active region is preferably 80% or more, particularly preferably 90% or more, most preferably 95% or more, e.g., 96% or more.

For the mirror coating, the mirror-coated side is expediently provided with a mirror layer. The mirror layer is preferably deposited on the component, e.g., by means of a PVD or CVD method (PVD: physical vapor deposition; CVD: chemical vapor deposition), such as by sputtering, vapor deposition or reactive sputtering.

The component is, furthermore, preferably mirror-coated on the outside. A side face of the component that delimits the component in a primary lateral direction of extent of the active region is, for instance, mirror-coated for this purpose.

In one preferred embodiment, the mirror layer comprises a mirror metallization or a mirror alloy that itself preferably contains at least one metal. In particular, the mirror layer may be formed electrically conductive. The mirror layer may, for instance, contain Ag, Al or Au. The mirror layer may, in particular, be implemented as a mirror metallization, using, for example, one of the named metals, or as an alloy layer, using, for example, at least one of the named metals. Metals or alloys exhibit high reflectivities over a wide spectral range, but often also in the spectral range of heat radiation.

Alternatively or in addition to an electrically conductive mirror layer, such as an electrically conductive mirror metallization or an electrically conductive mirror alloy layer, the mirror coating, in particular, the mirror layer, may comprise a cold-light reflector. Preferably, the cold-light reflector is implemented in such a way that it reflects the radiation generated in the active region, yet transmits waste heat occurring in the component when the radiation is generated. In this way, the risk of thermally induced damage to the component resulting from excessive internal temperatures within the component is minimized.

In one preferred embodiment, the mirror coating and, in particular, the mirror layer comprises a dielectric mirror layer. When a dielectric mirror layer is used, it is possible to omit extensive insulation measures required to insulate the mirror layer from electrically conductive elements of the component in order to prevent a short-circuit. A dielectric mirror layer can be implemented as a multi-layer structure, incorporating dielectric layers with different refractive indices. The cold-light reflector may, in particular, be implemented as a dielectric multi-layer structure.

In a further preferred embodiment, the mirror coating and, in particular, the mirror layer comprises a dielectric mirror layer and an electrically conductive mirror layer. A dielectric mirror layer, e.g., the cold-light reflector, may thus be employed in combination with an electrically conductive mirror layer, e.g., a mirror metallization or a mirror alloy of the type described further above. In this case, the electrically conductive mirror layer is advantageously located on that side of the dielectric mirror layer that faces away from the component. Radiation generated in the active region then first meets the dielectric mirror, where it may be partially reflected already. A portion of the radiation that passes through the dielectric mirror layer may be reflected at the electrically conductive mirror layer. Both, the dielectric mirror layer and the electrically conductive mirror layer, thus contribute to the total reflectivity of the mirror coating. It is therefore possible under appropriate circumstances to use materials with a relatively low reflectivity, e.g., of 80% or less and preferably of 70% or more, for a mirror metallization or alloy. By providing a dielectric mirror layer, an increase in the total reflectivity of the mirror coating that comprises the dielectric mirror layer and the electrically conductive mirror layer can be achieved.

Preferably, the component is implemented as a light-emitting diode, particularly preferably for the generation and, in particular, for the output of incoherent radiation. The component, moreover, is preferably designed to generate visible radiation.

External electrical contact connection of the component from the connection side may be made via the connecting faces of the contacts. In this way, it is possible to avoid the need to provide electrical contacts on other sides of the component. Electrical contacts for optoelectronic components, e.g., contact metallizations or alloy-based contacts, usually absorb significant amounts of the radiation generated in the active region. Because, in the present case, both connecting faces are located on the same side of the component, it is possible for radiation to be output through any other side of the component without a contact being provided on that side. Absorption in a contact on the output side is avoided in this way. Apart from the connection side, the remaining outer sides of the not-yet mirror-coated component may be free from any absorbent structures, such as absorbent metals, that would hinder the output. The radiant exitance output from the output face can be increased by the additional reflective mirror coating.

The output face is advantageously not mirror-coated.

Furthermore, the provision of two contacts on the common connection side of the optoelectronic component simplifies economical composite manufacture of components of this type.

In one preferred embodiment, the connection side of the component is the mounting side of the component. The mounting side of the component here refers to the side of the component that faces a connection carrier when the component is mounted on the external connection carrier, preferably a connection carrier of large area such as a circuit board. The contacts of the component may be electrically conductively connected with connection conductors of the connection carrier, allowing external electrical power to be supplied to the active region for operation of the component. The conductive connection may be implemented by means of an electrically conductive connecting layer. A bond wire, which has a high space requirement owing to the curve of the wire, is not required for making contact with the component.

The connecting faces of the contacts of the component are preferably formed for electrical connection to the connection conductors of a connection carrier by means of an electrically conductive layer connection. The connecting faces may, for instance, each be formed by means of a solder.

The component may be designed as a surface-mountable device (SMD).

In a method according to the invention for the manufacture of a plurality of optoelectronic components, a composite element comprising a carrier layer and a plurality of semiconductor bodies arranged on the carrier layer, preferably next to one another, each of the semiconductor bodies comprising an active region suitable for generating radiation, is at first provided.

A mirror layer is then applied onto the composite element. The mirror layer may, in particular, be deposited onto the composite element. The PVD or CVD methods mentioned above are, for instance, suitable for this purpose.

The semiconductor bodies are preferably implemented as discrete semiconductor bodies, arranged spaced apart from each other on the common carrier layer.

After application of the mirror layer, the composite element is singularized into a plurality of optoelectronic components, the components each having an output face and a mirror-coated side-face, different from the output face, which delimits the component and which is provided with the mirror layer.

The mirror-coated side-face delimits the component preferably in a lateral direction, in particular, in the direction of extent of the active region. The side face may extend away from the connection side of the component, extending in the direction of and preferably as far as to a side of the component that faces away from the connection side.

The mirror layer applied onto the composite element and/or the carrier layer is preferably cut through when the components are singularized. The components that have been singularized from the composite element may accordingly each include a part of the mirror layer that was applied onto the composite element.

Components with a mirror-coated side-face may thus be manufactured in a composite, which is an aid to economical manufacture of a plurality of components of the same type.

The method of manufacture according to the invention is preferably employed for the manufacture of optoelectronic components according to the invention, so that features described above and below for the component may also apply to the method of manufacture, and vice versa.

The semiconductor bodies of a composite element are preferably all of the same type, in particular, being formed with the same sequence of identically constituted semiconductor layers.

The output face of the component may be a singularized output face, i.e., an output face formed during the singularization process. In this case the output surface preferably delimits the component laterally.

In one preferred embodiment, the electrical contacts for electrical contact connection with the semiconductor body of the component that is to be manufactured are provided before the mirror layer is applied. Thereby, two contacts are preferably assigned to one semiconductor body of the composite element, and these contacts are arranged on one side of the semiconductor body, in particular, on the same side of the semiconductor body, preferably the connection side of the later component. The contacts preferably are electrically conductively connected to the active region of the semiconductor body (that is assigned to the contact concerned). The contacts, furthermore, are expediently at least partially arranged on the same face of the semiconductor body, particularly on the side of the active region that faces away from the carrier layer.

Arranging the contacts in this way on one side of the semiconductor body simplifies the manufacture of a plurality of components in a composite.

In a further preferred embodiment, the component comprises a carrier on which the semiconductor body is located. A semiconductor body that has been grown epitaxially may be mechanically stabilized by the carrier. In this way the risk of damage to the semiconductor body is reduced. The carrier may be formed, when singularizing the composite element, from the carrier layer which is cut through during singularization.

The carrier layer may be formed from the growth substrate on which a semiconductor layer structure was grown, from which layer structure the semiconductor bodies of the composite element are formed.

The carrier may, however, also be different from the growth substrate. After the semiconductor layers for the semiconductor bodies have been grown on the substrate, it may be removed. Expediently, the carrier, or a corresponding carrier layer from which a carrier is singularized, is provided before the substrate is removed, so that the semiconductor material is mechanically stabilized during removal. The component may thus be free from the growth substrate that was used to grow the semiconductor layers of the semiconductor body.

Alternatively, however, a carrier that stabilizes the semiconductor body may be omitted. The component may, in particular, consist of the epitaxially grown semiconductor layers of the semiconductor body, the contacts and, if applicable, further layers applied to the semiconductor body that are preferably not self-supporting. The contacts and/or the further layers applied to the semiconductor body may be applied to the semiconductor body by a deposition process. During deposition, the layer thickness increases with the deposition time.

The component may therefore be implemented as a carrier-less component. It is possible to dispense with a specially provided, in particular, a self-supporting, carrier for mechanical stabilization of the semiconductor body. The substrate for epitaxial growth may, for instance, be removed for a carrier-less component.

Owing to the absence of a carrier, a very low component height can be achieved. In comparison with components that have carriers, the handling, e.g., during mounting, of components of this type calls for increased care in order to avoid damaging the component.

In a preferred embodiment, the connecting faces of the contacts are arranged on a common, preferably plane, surface of the semiconductor body. The connecting faces may, in particular, extend over this surface. This surface is preferably arranged between the active region and the connecting faces of the contacts. One of the contacts is expediently electrically conductively connected, preferably directly, to the semiconductor body on the side of this surface of the semiconductor body. The other contact then preferably is electrically conductively connected to the semiconductor body on that side of the active region that faces away from this surface.

The connecting faces are, moreover, preferably located on the side of the active region of the semiconductor body that faces away from the carrier.

The contacts are, furthermore, preferably applied to the semiconductor body, and particularly preferably are deposited onto the semiconductor body. The contacts may, for instance, be applied to the semiconductor body by means of a PVD or CVD method, such as by vapor deposition or one of the other methods mentioned further above.

In another preferred embodiment, the contacts are electrically insulated from one another on the connection side. The contacts may be electrically separated from one another on the connection side by means of an insulation layer for this purpose.

In another preferred embodiment, one of the contacts extends in an area between the semiconductor body and the connecting face of the other contact. In spite of arranging the two connecting faces on one side of the semiconductor body, injection of charge carriers into the semiconductor body that is distributed over the lateral extent of the semiconductor body can be achieved by extending the one contact underneath the connecting face of the other contact.

In another preferred embodiment, one of the contacts is electrically conductively connected to the semiconductor body on the connection side, while the other contact is electrically conductively connected to the semiconductor body on the side of the active region that faces away from the connection side of the component. The last-mentioned contact may extend for this purpose from the connection side over the region of the active region as far as the side of the active region that faces away from the connection side, and may be electrically conductively connected to the semiconductor body on this side. Expediently, for this purpose this contact is electrically insulated from the semiconductor body from the connection side as far as to the side of the active region that faces away from the connection side, for example, by means of an insulating layer that extends along the semiconductor body. In this way, a short-circuit of the component may be avoided.

An opening may be formed through the active region in the semiconductor body, through which opening the contact extends from one side of the active region to the other side of the active region. The opening may, for instance, be formed by a recessed region of the semiconductor body that penetrates from the connection side into the semiconductor body and is filled with the contact material. In particular, a plurality of openings through the active region can be present, through which the contact can extend from one side of the active region to the other side of the active region.

Alternatively or in addition to the provision of an opening, the contact may also extend next to a side face that laterally delimits the semiconductor body from the connection side as far as to the side of the active region that faces away from the connection side. In this case, a local recess in the semiconductor body may be omitted. The contact, for this purpose may, for instance, at least in some areas, be formed in the form of a frame. Here again it is expedient to electrically insulate the contact from the active region, for instance by means of an insulation layer extending along the side face, so that a short-circuit of the component is avoided.

In a further preferred embodiment one of the contacts comprises a contact layer. This contact layer is preferably in an area arranged between the semiconductor body and the connecting face of the other contact. Preferably, the contact layer extends extensively over the semiconductor body. The contact layer may extend, in particular, from the connecting face of the one contact as far as, and preferably under, the connecting face of the other contact. The contact layer permits large-area electrical conductive connection of the contact to the semiconductor body, so that through this contact homogeneous injection of charge carriers into the semiconductor body can be achieved over a large area.

The contact layer is preferably interrupted, preferably it is interrupted only, to permit the other contact to pass through the contact layer. The contact layer can thus be implemented as a continuous layer or as a layer that is interrupted to permit the passage of the other contact. Expediently, the contact layer is electrically insulated for this purpose from the other contact. A recess in the contact layer can, for instance, be omitted if the other contact extends next to a side face of the semiconductor body from the connection side as far as to the side of the active region that faces away from the connection side.

In a further preferred embodiment, the component comprises a reflector layer, particularly on the connection side. One of the contacts, preferably the contact with the contact layer, may comprise the reflector layer. The reflector layer is expediently arranged on a side of the contact layer that faces away from the semiconductor body. The reflector layer is, moreover, preferably arranged between the connecting face of one of the contacts, particularly preferably between the connecting faces of both contacts, and the semiconductor body. By means of the reflector layer, radiation that is generated within the active region and that emerges from the semiconductor body in the direction of the connection side may be reflected back into the semiconductor body. In this way, absorption of the radiation in the contacts can be minimized. As a result, the radiation power that can be output from the component is increased.

In a further preferred embodiment, the composite element is provided a protective layer in some areas prior to the application of the mirror layer. The protective layer is preferably removed after the mirror layer has been applied. The protective layer can provide protection to those areas of the composite element that are not to be directly covered by the mirror layer. Any material for the mirror layer that happens to reach the protective layer can be removed together with the protective layer. It is particularly advantageous to cover the contacts with the protective layer. In this way a short-circuit of the contacts by electrically conductive mirror layer material can be avoided.

In a further preferred embodiment, one face of the composite element intended to form the output face is at first mirror-coated, and the mirror layer is then removed again to form the output face. Preferably the mirror layer for the output face is removed from the composite element before the composite element is singularized into components. The mirror layer may, for instance, be removed by means of a mechanical process, e.g., by means of grinding.

In a further preferred embodiment, the face of the composite element that is intended to form the output face is covered with the protective layer, the protective layer is then mirror-coated, and the mirror-coated protective layer is then removed again. Preferably, the protective layer is removed prior to singularization of the composite element. An output face for the component without mirror coating may be provided also in this way.

In a further preferred embodiment, a side of the composite element that is intended to form the output face, in particular, a face of the composite element that is intended to form the output face, is shadowed during application of the mirror layer. If this side is shadowed during the application of material for the mirror layer onto the composite element, then the side of the composite element that is intended to form the output face, and therefore also the output face, are not covered with the material for the mirror layer. For this purpose, the composite element may be arranged on an auxiliary carrier in such a way that the side that is intended to form the output face faces the auxiliary carrier.

Alternatively, it may also be expedient for the composite element to be arranged with the connection side on the auxiliary carrier in such a way that the connection side is shadowed when the mirror layer is applied. In this case the connection side faces the auxiliary carrier.

In a further preferred embodiment, the output face of a component is created when the composite element is singularized. Singularization of the composite element may, for instance, create two components with output faces that face one another.

In a further preferred embodiment, the output face of the component comprises raised areas and depressions. A plurality of depressions may be formed in the output face for the singularization and, in particular, during singularization of the component. The depressions may, for instance, be generated by scribing, in particular, by means of a laser. A raised area is formed between two neighboring depressions. If the output face has a structured surface, output of radiation from the output face is advantageously simplified. In particular, total reflection at the output face may be perturbed by the structure of the output face.

In a further preferred embodiment, the composite element is mirror-coated on every side and preferably over its whole area (if applicable, with the exception of the shadowed side), in particular, after the contacts have been provided.

The finished component may, with the exception of the output face and, preferably, the connection side, be mirror-coated on every side, in particular, on the outside. As a result of reflection at the mirror-coated sides, radiation in the component is guided to the output face. By means of mirror coating on every side a particularly high radiant exitance can be achieved from the non-mirror-coated output face.

One, a plurality of, or all the mirror-coated sides or faces of the component can be mirror-coated over their whole area.

The output face may be formed by means of a surface of the carrier, preferably a side face of the carrier, e.g., for a laterally emitting component, or the surface of the carrier that faces away from the connection side, e.g., for a surface-emitting component, or by a surface of the semiconductor body, preferably a side face of the semiconductor body, e.g., for a laterally emitting component, or the surface of the semiconductor body that faces away from the connection side, e.g., for a surface-emitting component. Forming the output face by means of a surface of the semiconductor body is particularly expedient for carrier-less components.

In a further preferred embodiment, the side of the carrier that faces away from the semiconductor body, one or a plurality of side faces that delimit the carrier, and/or one or a plurality of side faces that delimit the semiconductor body is mirror-coated. Alternatively or in addition, the side of the carrier that faces the semiconductor body may be mirror-coated, particularly in regions in which the carrier is free from the semiconductor body.

In a further preferred embodiment, a plurality of composite elements is provided, arranged on an auxiliary carrier. The auxiliary carrier is preferably expandable. The expandable auxiliary carrier is preferably expanded prior to applying the mirror layer that is, for example, applied to the plurality of composite elements, so that an interspace in between neighboring composite elements is enlarged during application of the mirror layer. Applying the mirror layer to those faces of neighboring composite elements that face one another is made easier in this way.

In a further preferred embodiment, the composite elements are obtained by singularizing an initial composite. The initial composite is preferably arranged on the auxiliary carrier before the initial composite is separated, so that the singularized composite elements are stabilized by the auxiliary carrier and are, in particular, held in composite by the auxiliary carrier. The initial composite may comprise a semiconductor layer structure, from which the semiconductor bodies are formed prior to singularizing the initial composite. The contacts, moreover, are preferably formed prior to singularization of the initial composite.

The component may be configured as a component that emits laterally (known as a side-looker) or as a surface-emitting component (known as a top-looker).

In the first case the output face of the component extends transversally to the primary lateral direction of extent of the active region, and, in particular, transversally to the connecting face. In this case, the output face may be formed by a side face that laterally delimits the carrier. The mirror coating guides the radiation to this output face. A side-looker of this type can be manufactured economically in the composite. A laterally-emitting component may emit radiation parallel to a mounting surface where this component is mounted on the connection carrier.

It has been found particularly advantageous for a side-looker component if a mirror-coated face of the component, running obliquely with respect to the active region, in particular, at an, preferably acute, angle other than 90°, extends over the active region. Preferably this face entirely covers the active region. Particularly preferably, this face is located on the side of the active region that faces away from the connection side.

In a top-looker, the side of the carrier that faces away from the semiconductor can form the output face. A top-looker can emit radiation perpendicularly to the mounting face of the component on the connection carrier.

The component is preferably configured as a chip-like component, in particular, as a flip-chip-like component. The component may, furthermore, be implemented with the size of a chip. A lateral extension of the component, in plan view onto the active region is, in comparison with the lateral extension of the active region, preferably small for a component with the size of a chip.

The ratio of the area of the surface covered by the semiconductor body, viewed in plan view on the connection side, to the area content of the total area over which the component extends in plan view on the connection side, may for this component be greater than 0.2, preferably greater than 0.3, particularly preferably greater than 0.5 and most preferably greater than 0.7.

Moreover, with the component described here it is possible to dispense with an additional housing for protection of the component, into which the component is fitted but that is not manufactured together with the component in the composite.

BRIEF DESCRIPTION OF THE DRAWINGS

Further features, advantages, and advantageous embodiments arise from the following description of the exemplary embodiments in connection with the figures.

FIG. 7 shows a further exemplary embodiment of an optoelectronic component by means of a schematic sectional view.

FIG. 8 shows a further exemplary embodiment of an optoelectronic component by means of a schematic sectional view.

The same, similar, and elements of equivalent function are provided with the same reference numbers in the figures.

DETAILED DESCRIPTION OF ILLUSTRATIVE EMBODIMENTS

Figure 1A:
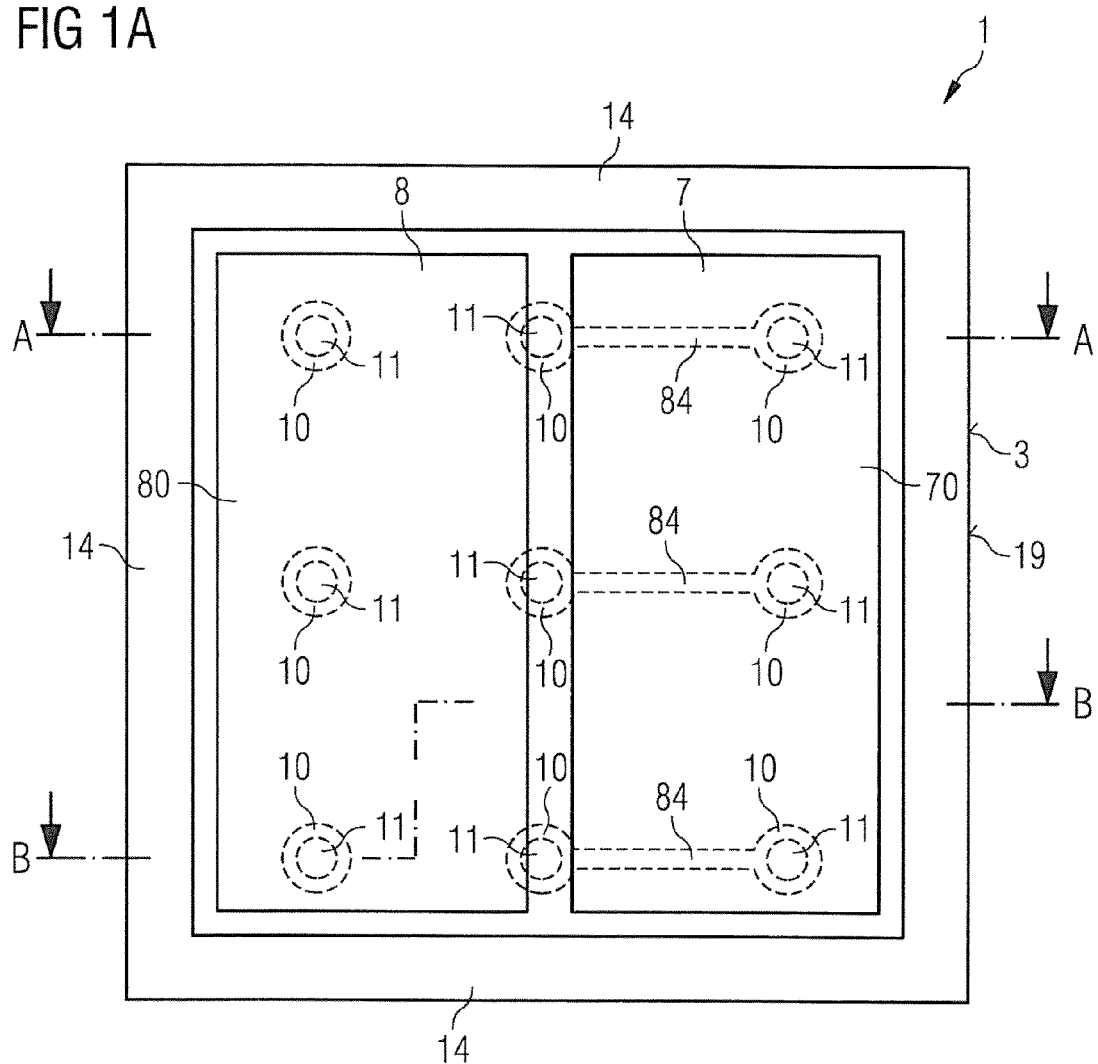
FIG. 1 shows a first exemplary embodiment of an optoelectronic component based on a schematic plan view in FIG. 1A, two schematic sectional views in FIGS. 1B and 1C, a simplified schematic sectional view in FIG. 1D, and a partial sectional view in FIG. 1E.
Figure 1B:
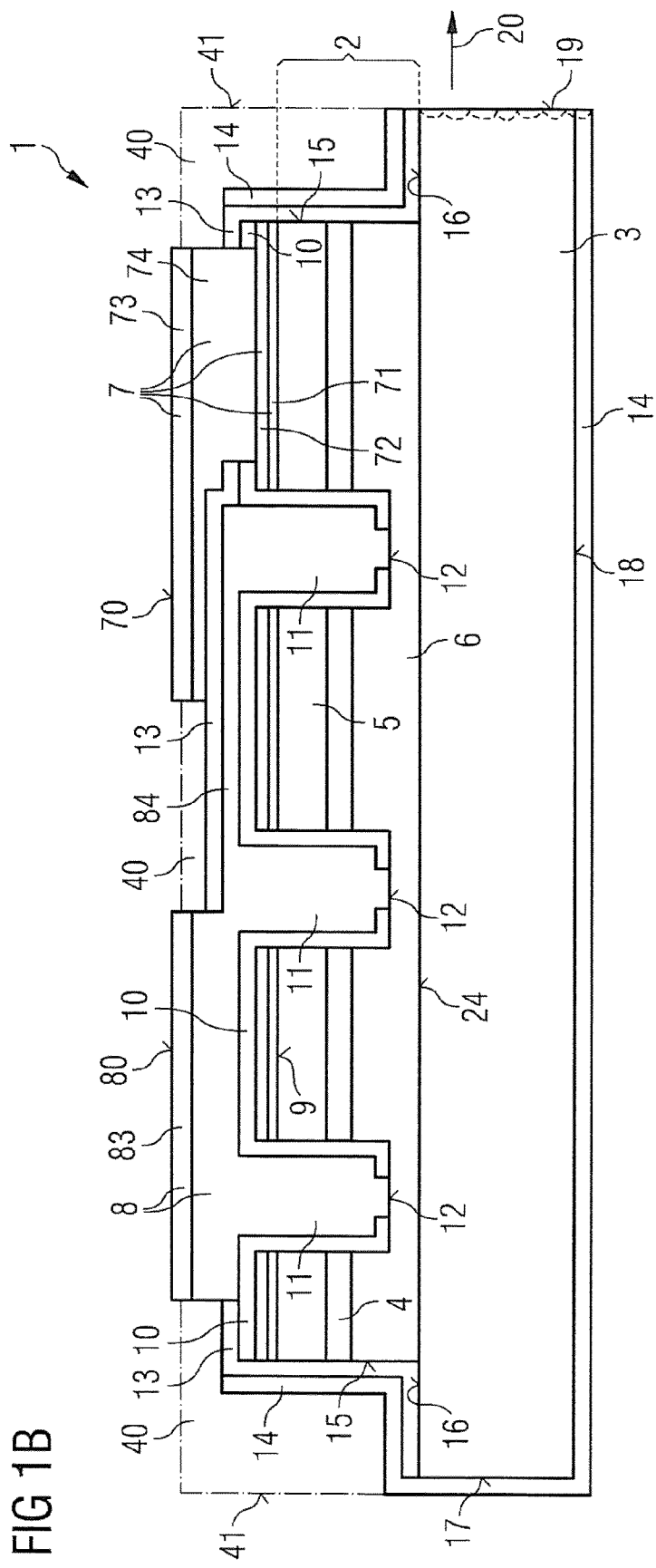
Figure 1C:
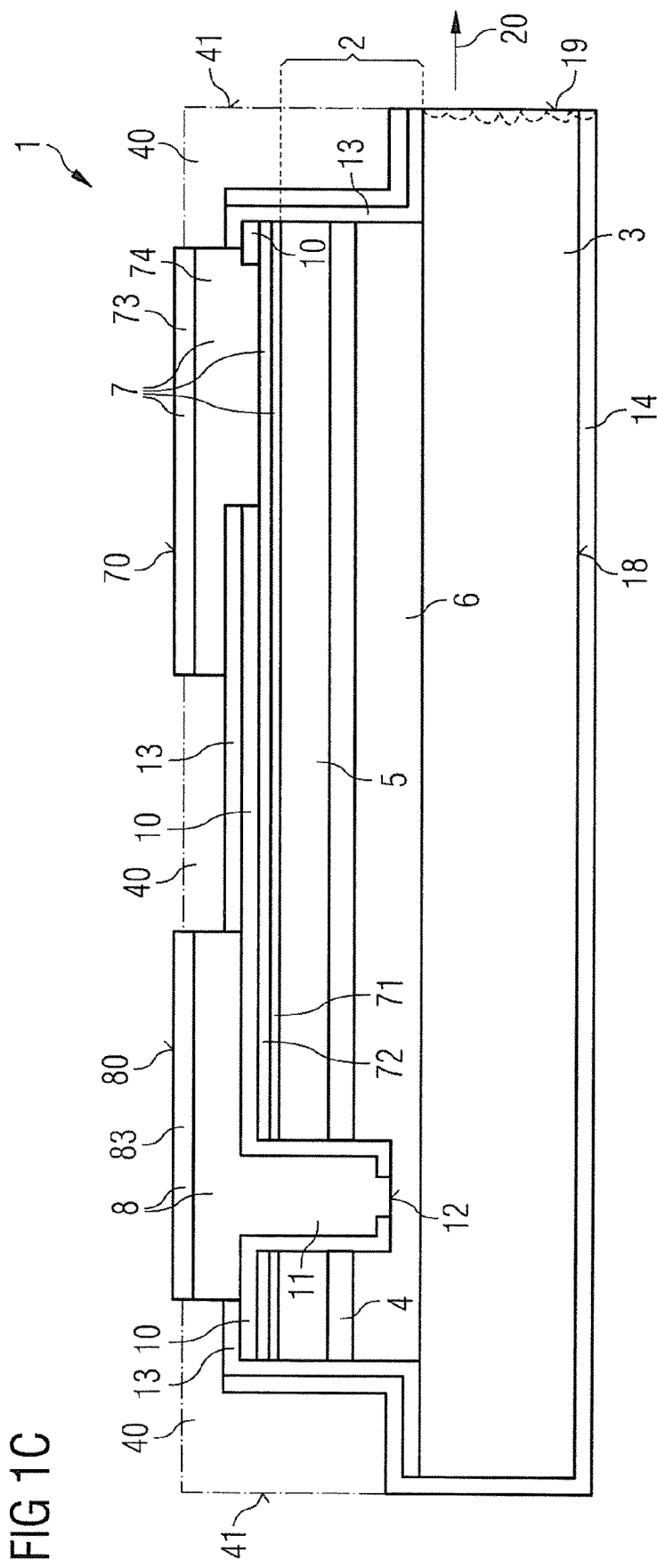
Figure 1D:
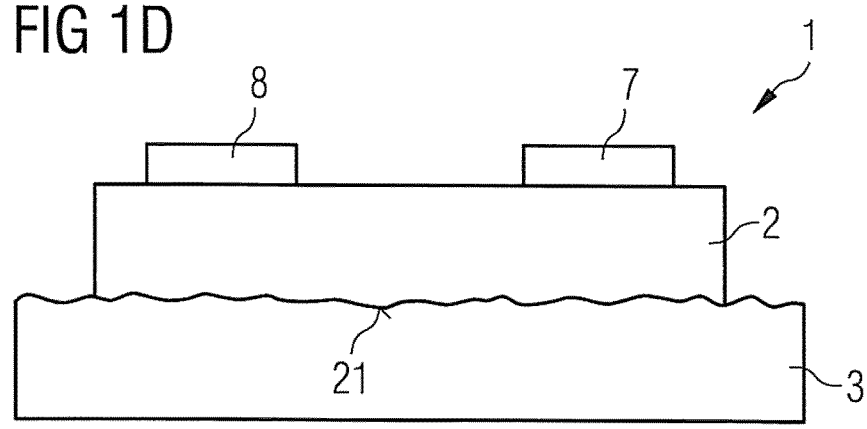
Figure 1E:
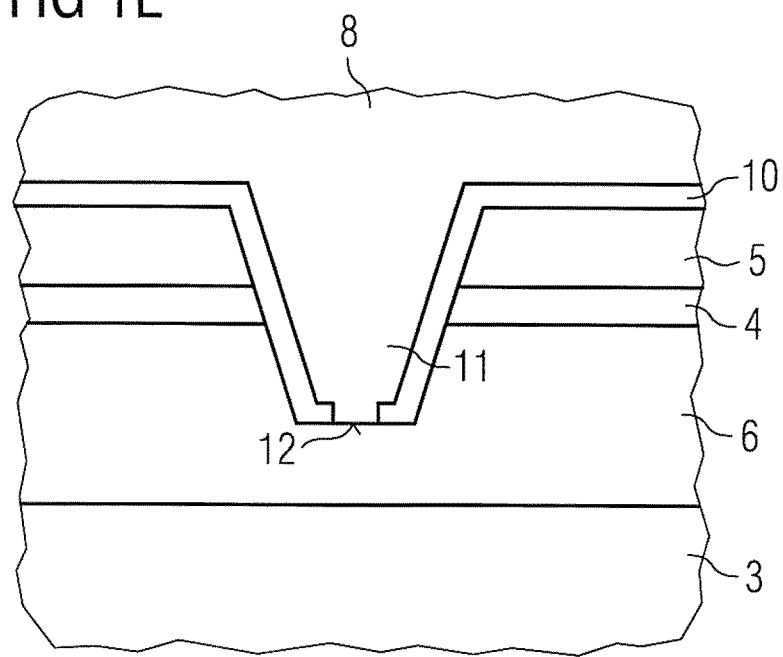

FIG. 1 shows a first exemplary embodiment of an optoelectronic component based on a schematic plan view in FIG. 1A, two schematic sectional views in FIGS. 1B and 1C, a simplified schematic sectional view in FIG. 1D, and a partial sectional view in FIG. 1E. Thereby, FIG. 1B corresponds to a section along the line A-A in FIG. 1A and FIG. 1C corresponds to a section along the line B-B in FIG. 1A.

The optoelectronic component 1 comprises a semiconductor body 2. The semiconductor body is arranged on a carrier 3 which the component 1 comprises. The semiconductor body 2 comprises a semiconductor layer sequence with an active region 4 capable of generating radiation. The semiconductor layer sequence may, in particular, comprise multiple semiconductor layers, with the active region being located between them. The semiconductor layer sequence, moreover, preferably constitutes the semiconductor body 2.

The semiconductor body 2 is preferably configured as a light-emitting diode semiconductor body. In particular, the semiconductor body preferably comprises two regions 5, 6 having different types of conductivity (n-type or p-type). The active region 4 is preferably located or formed between these regions 5 and 6.

The active region 4 preferably comprises a heterostructure, in particular, a double heterostructure, or a quantum structure, particularly preferably a single or multiple quantum well structure, a quantum wire structure or a quantum dot structure. Structures of this type exhibit particularly high internal quantum efficiencies when generating radiation in the active region.

The semiconductor layer sequence is preferably grown epitaxially on a growth substrate. The carrier 3 can be formed from the growth substrate when manufacturing the component 1, or can be different from the substrate. In the latter case, the carrier 3, or the material from which the carrier 3 is formed, is preferably applied to the grown semiconductor material before the growth substrate is removed from the grown semiconductor material. Mechanical stabilization of the grown semiconductor material is provided by the carrier 3 even when the substrate used for growth has been removed. If the carrier 3 differs from the growth substrate, the carrier may be bonded as a hard carrier body to the grown semiconductor material, or a molding compound may at first be applied to the semiconductor body which molding compound is then hardened in order to form a carrier. BCB (benzo-cyclo-butene) is, for instance, suitable for use as this kind of molding compound. A Glass, for instance, is suitable as the hard carrier body.

The carrier 3 is preferably radiation transmissive for the radiation to be generated in the active region 4, so that the radiation can pass from the active region 4 into the carrier, and can then be output from the component 1 through the carrier.

In one preferred embodiment, the semiconductor layer sequence, particularly regions 5 and 6 of the semiconductor body and/or the active region 4, comprises a III-V semiconductor material. By means of III-V compound semiconductor materials, in particular, nitride-compound semiconductor materials, phosphide-compound semiconductor materials or arsenide-compound semiconductor materials, high internal quantum efficiencies in the conversion of electrical power into radiation power can be achieved relatively easily. The active region, and, in particular, the semiconductor body, is therefore preferably based on one of the named material systems.

"Based on phosphide-compound semiconductors" means, in this connection, that the active region 4, in particular, the semiconductor body, preferably comprises or consists of $Al_nGa_mIn_{1-n-m}P$, where $0 \leq n \leq 1$, $0 \leq m \leq 1$ and $n+m \leq 1$, preferably with $n \neq 0$, $n \neq 1$, $m \neq 0$ and/or $m \neq 1$. It is not essential that the material precisely matches a mathematical composition in accordance with the above formula. It can, rather, include one or more doping materials or additional components that make no significant difference to the physical properties of the material. For the sake of simplicity, however, the above formula shows only the principal components of the crystal lattice (Al, Ga, In, P), even if these can in part be replaced by small quantities of other substances.

"Based on nitride-compound semiconductors" means, in this connection, that the active region, in particular the semiconductor body 2, preferably comprises or consists of Al$_n$-Ga$_m$In$_{1-n-m}$N, where $0 \leq n \leq 1$, $0 \leq m \leq 1$ and $n+m \leq 1$, preferably with $n \neq 0$, $n \neq 1$, $m \neq 0$ and/or $m \neq 1$. It is not essential that the material precisely matches a mathematical composition in accordance with the above formula. It can, rather, include one or more doping materials or additional components that make no significant difference to the physical properties of the material. For the sake of simplicity, however, the above formula shows only the principal components of the crystal lattice (Al, Ga, In, N), even if these can in part be replaced by small quantities of other substances.

"Based on arsenide-compound semiconductors" means, in this connection, that the active region, in particular the semiconductor body 2, preferably comprises or consists of Al$_n$-Ga$_m$In$_{1-n-m}$As, where $0 \leq n \leq 1$, $0 \leq m \leq 1$ and $n+m \leq 1$, preferably with $n \neq 0$, $n \neq 1$, $m \neq 0$ and/or $m \neq 1$. It is not essential that the material precisely matches a mathematical composition in accordance with the above formula. It can, rather, include one or more doping materials or additional components that make no significant difference to the physical properties of the material. For the sake of simplicity, however, the above formula shows only the principal components of the crystal lattice (Al, Ga, In, As), even if these can in part be replaced by small quantities of other substances.

For nitride-compound semiconductors the growth substrate may, for instance, be a sapphire substrate, a SiC substrate or a GaN substrate, while for phosphide and arsenide compound semiconductors a GaAs growth substrate is, for instance, suitable.

Nitride and phosphide compound semiconductor materials are particularly suitable for the generation of visible radiation. Arsenide compound semiconductor materials are particularly suitable for the infrared spectral region. Nitride compound semiconductor materials are particularly suitable for the generation of radiation extending from the ultraviolet spectral region through the blue and into the green spectral region and phosphide compound semiconductor materials are suitable for radiation from the orange through to the red spectral region.

Preferably, the component 1, and, in particular, its active region 4, is designed to generate visible radiation. The component is, furthermore, preferably designed as an LED component to emit incoherent radiation.

The optoelectronic component 1 has two electrical contacts, a first contact 7 and a second contact 8. The contacts 7 and 8 are electrically conductively connected to the semiconductor body 2 on different sides of the active region 4. When the component is operated, charge carriers can be injected into the active region via the contacts 7 and 8. These can recombine there, emitting radiation as they do recombine. The contacts 7 and 8 are arranged on the side of the semiconductor body that faces away from the carrier 3.

The contacts 7, 8 each have a connecting face 70 and 80 respectively. The connecting faces each face away from the semiconductor body 2. The connecting faces 70, 80, are, furthermore arranged on the same side of the semiconductor body 2, and particularly on the same side of the active region 4, the connection side of the component 1. The connection side of the component 1 is preferably arranged on the side of the semiconductor body 2 that faces away from the carrier 3. FIG. 1A shows a view from above of the connection side of the component.

The connecting faces 70 and 80 extend, moreover, over a common surface 9 of the semiconductor body 2. This surface is located between the active region 4 and the connecting faces 70, 80 of the two contacts. The connecting faces 70 and 80 are arranged side-by-side on the surface 9. The contacts 7 and 8 can, in particular, be applied onto this surface 9 of the semiconductor body 2.

The connecting faces 70, 80 are preferably provided for electrical conductive connection of the optoelectronic component with connecting conductors from an external connection carrier, e.g., the tracks of a circuit board. It is particularly preferred for the connecting faces 70 and 80 to face the contacts of the connection carrier when the component 1 is mounted on the connection carrier. The connection side of the component can thus at the same time form the mounting side of the component for mounting on the connection carrier (not explicitly illustrated). The component can thus be designed as a component of the flip-chip type.

The contacts 7, 8 can, for example, be formed by the deposition of material for the contacts onto the surface 9 of the semiconductor body 2. The deposition can, for instance, be performed by means of a PVD or CVD method such as sputtering, vapor deposition or reactive sputtering.

The contacts are preferably implemented on the basis of metal. The contacts may, in particular, contain a metal-based alloy such as AuSn or AuZn, or a metal such as Au, Al, Ag, Pt or Ti, and may, in particular, consist of one or a number of metal-based alloys and/or one or a number of metals.

The first contact 7 is electrically conductively connected to the semiconductor body 2 on the side that faces the connecting faces 70, 80. In particular, the first contact 7 is electrically conductively connected to the region 5 of the semiconductor body 2. The second contact 8 is electrically conductively connected to the semiconductor body 2 on the side of the active region that faces away from the connecting faces 70, 80, in particular to the region 6 of the semiconductor body 2. The two contacts are electrically insulated from one another on the connection side, and, in particular, from the surface 9 through to that side of the active region 3 that faces away from this surface.

The first contact 7 comprises a contact layer 71. This is electrically conductively connected, particularly directly, via the surface 9 to the semiconductor body 2. Charge carriers can be injected over a large area on the connection side into the semiconductor body through the large area of the contact layer. The first contact 7 furthermore preferably comprises a reflector layer 72. This is preferably located on the side of the contact layer 71 that faces away from the semiconductor body. The reflector layer 72 preferably extends, like the contact layer 71, over a wide area across the surface 9 of the semiconductor body. The contact layer 71 and, preferably, the reflector layer 72, are located between the connecting face 80 of the second contact 8 and the surface 9. The contact layer 71 and, preferably, the reflector layer 72, extend from the connecting face of the first contact 7 to underneath the connecting face 80 of the second contact 8.

The first contact 7 preferably comprises a connection layer 73 on the side of the connecting face 70, particularly preferably a layer of solder such as a gold-tin solder layer. The second contact 8 preferably comprises a connection layer 83 on the connection side, preferably a layer of solder such as a layer of gold-tin solder. The surfaces of the connection layers 73 and 83 that face away from the semiconductor body 2 preferably form the connecting faces of the respective contacts.

The connecting face 70 of the first contact 7 preferably is electrically conductively connected to the contact layer via a further layer 74 of the first contact.

Charge carriers can be injected into the semiconductor body 2 via the contact layer 71. A contact layer 71 that contains metal can already exhibit a comparatively high reflectivity for the radiation that is to be generated in the active region 4. It is, however, advantageous to provide a separate reflector layer, as each layer can then be optimized for its particular function. The contact layer 71 can thus be optimized for electrical contact formation with the semiconductor body 2 and may, for instance, be semitransparent, whereas the reflector layer 72 can be chosen to offer high reflectivity for the radiation that is to be generated in the active region 4. It is not necessary to consider the electrical contact properties between the reflector layer and the semiconductor material.

In the case of nitride compound semiconductor materials, Pt is particularly suitable for a contact layer 71 to p-type semiconductor material, and Al, with respect to its high reflectivity, for the reflector layer 72.

P-type nitride materials, GaN in particular, often exhibit low lateral conductivity. It is therefore advantageous for charge carriers to be injected in the first place over a wide area into the semiconductor body, rather than relying on the current spreading within the semiconductor body 2 for a wide area injection of charge carriers into the active region. The region 5 of the semiconductor body 2 is preferably p-type.

In order to avoid a short-circuit between the contacts 7 and 8 on the connection side, the contacts are electrically insulated from one another on the connection side. A first insulation layer 10 is located between the connecting face 80 of the second contact 8 and the contact layer 71, and between the reflector layer 72 and the connecting face 80 if relevant. This insulation layer insulates the second contact 8 on the connection side from the first contact 7 and, in particular, insulates the second contact 8 from the surface 9 of the semiconductor body 2. The insulation layer 10 is preferably located over the whole area between the contact layer 71 and the second contact 8.

The second contact 8 extends through one or, preferably, through a number of openings through the active region 4 from the side of the semiconductor body 2 that faces the connecting faces 80 and 70 through to the side of the active region 4 that faces away from the connecting faces. For this purpose the semiconductor body 2 has one or a number of recesses 11 through which the second contact 8 extends. The recess(es) is (are) preferably formed locally in the semiconductor body. The recess(es) 11 is (are) preferably delimited laterally circumferentially by the semiconductor body.

The wall of the recess 11 is cladded with an insulation material, preferably the insulation layer 10, which has an opening for a contact point 12 on the side of the active region 4 facing away from the connecting faces. Via the contact point 12, the second contact 8 is electrically conductively connected to the semiconductor body, preferably directly to the region 6 of the semiconductor body. The contact point 12 is advantageously formed at the floor of the (relevant) recess 11.

The insulation layer 10 contains, for instance, a silicon nitride such as SiN, a silicon oxide such as SiO2, or a silicon oxynitride such as SiON.

The contact layer 71 and, if relevant, the reflector layer 72, preferably have openings for the passage of the second contact 8. Apart from the openings to allow the passage of the second contact 8, the contact layer 71 and, preferably, the reflector layer 72, are preferably continuous. The contact layer and, preferably, the reflector layer can, apart from the areas opened for passage of the second contact 8, cover the entire surface 9 of the semiconductor body 2 that faces the connecting faces 70, 80.

The local contact points 12 are advantageously distributed over the extent of the semiconductor body. Preferably the contact points are evenly distributed in a regular pattern, for instance like on a grid. The contact points thus allow charge carriers to be laterally distributed across the semiconductor body to enter the semiconductor body locally. Advantageously, the semiconductor material of the semiconductor body 2 that is contacted via the second contact 8 exhibits a higher conductivity in the lateral direction, i.e., parallel to the active region 4, than the material that is contacted by the first contact 7. In spite of the fact that the semiconductor body 2 is only contacted at certain points by the second contact 8, the spread of current in the semiconductor body can achieve a laterally homogenous current distribution. The injection of charge carriers over a wide area into the active region can thus be achieved in spite of the localized nature of the charge carrier injection.

In the case of nitride compound semiconductor materials, n-type material such as n-GaN often exhibits a significantly greater conductivity in the lateral direction than p-type material such as p-GaN. The region 6 of the semiconductor body is preferably implemented as n-type, while the region 5 of the semiconductor is p-type.

One or a number of openings through the active region 4, in particular multiple recesses 11 of the semiconductor body 2, preferably extend through the active region 4 under the connecting face 80 of the second contact 8 (see the plan view in FIG. 1A).

One or a number of openings through the active region, in particular multiple recesses 11 of the semiconductor body, extend preferably through the active region 4 under the connecting face 70 of the first contact 7 (see the plan view in FIG. 1A).

The second contact 8 preferably has one or a number of contact extensions 84. Each contact extension extends preferably away from the connecting face 80 of the second contact 8. The contact extension may, for instance, run in the form of a track. The (relevant) contact extension 84 preferably extends from the connecting face 80, over the surface 9, and particularly preferably over a number of openings, in particular recesses 11.

The relevant contact extension 84 is, furthermore, located between the connecting face 70 of the first contact and the semiconductor body. The parts of the contact that extend through further recesses in the semiconductor body over which the relevant contact extension extends may be electrically conductively connected to the connecting face 80 via the contact extension. The recesses 11 are preferably filled with contact material.

A second insulation layer 13 is advantageously located between the contact extension 84 and the connecting face 70 of the first contact 7. This insulation layer 13 advantageously insulates the contact extension 84 from the first contact 7. The contact extension may run between the two insulation layers 10 and 13. In particular, the relevant contact extension may be embedded in insulation material. In regions where no contact extension is located, the two insulation layers are advantageously adjacent. The materials mentioned above for the first insulation layer 10 may, for instance, be suitable for the second insulation layer 13.

A contact structure of this type makes it easier, in spite of the arrangement of the connecting faces 70 and 80 on the same side of the semiconductor body and, in particular, on the same face, to achieve injection of charge carriers into the active region 4 that is homogenous and extends over a large area on both sides. In this way the radiation generation efficiency of the component is increased.

By means of the reflector layer 72, absorption of radiation in structures located on the side of the reflector layer that faces away from the active region 4, for instance the tracks of a circuit board on which the component is mounted, can be prevented.

In order to fabricate the contact structure, for example, the contact layer 71 and, if relevant, the reflector layer 72 are deposited on material for the semiconductor body 2, preferably over the whole area. Thereafter, the contact layer and the semiconductor body can be removed in certain areas for the recesses 11, for instance by etching using a suitably patterned mask, and the insulation layer 10 applied. This insulation layer is preferably deposited over the full area, and then removed for the contact points, for instance by etching with the aid of a suitably patterned mask.

The second contact 8 can then be applied. Contact extensions 84 can then be covered with the second insulation layer 13. Following this, the part of the first contact 7 that is different from the contact layer 71 can be applied.

The multi-layer structure of the first contact 7, one layer with the contact layer 71 and, if relevant, the reflector layer 72 on the one hand, and a further layer with the remaining part of the first contact on the other hand, makes it easier, in combination with the electrical insulation of the two contacts from one another, to create a contact structure for the optoelectronic component 1. The contact extensions, in particular, can have arbitrary shape, and can be arbitrarily distributed across the semiconductor body 2.

Owing to the insulation of the second contact 8 on both sides, on the one hand at the connection side from the semiconductor body 2 and on the other hand from the second contact 8 by means of the insulation layers 10 and 13, the formation of any desired distribution of contact extensions across the semiconductor body 2 is further simplified. A contact structure of this type can, furthermore, be fabricated easily in the composite, that is to say simultaneously for a number of semiconductor bodies.

The connecting faces 70, 80, furthermore preferably lie in a common plane. This makes it easier to connect the connecting faces to external connection conductors. The component can be entirely fabricated in the composite. Making contact with the contact faces at a later stage using bonding wires can be omitted. It is more appropriate for the connecting faces, in the manner of a flip-chip, to be electrically conductively connected to external connection conductors, preferably directly, for instance by means of electrically conductive adhesive or solder.

An area of the component 1 is, moreover, mirror-coated. A mirror layer 14 is applied to the surfaces of the component, outer faces, in particular, for this purpose. The mirror layer is preferably deposited onto the component. The mirror layer contains, for instance, a metal. It is not necessary for the mirror layer 14 to be made as a single piece, but it can comprise a number of mirror layer pieces. In this case, different mirror layer pieces are preferably located on different surfaces of the component.

The mirror layer 14 is preferably formed by as metallization or as a metal-based alloy. Au is, for instance, particularly suitable for active regions based on phosphide compound semiconductor, or Al or Ag, particularly for active regions based on nitride compound semiconductors, or an alloy including one of the named metals may be particularly suitable.

Alternatively, the mirror layer 14 can be implemented as a dielectric mirror, in particular as a cold-light mirror. By means of a cold-light mirror it is possible to selectively achieve a high reflectivity for the radiation generated in the active region 4 whereas, for instance, thermal radiation that arises owing to thermal losses during generation of the radiation in the semiconductor body 2 can emerge out of the component through the mirror layer 14 relatively unhindered.

A multilayer structure comprising exclusively dielectric layers, in particular, a sequence of a large number of dielectric layer pairs having layers with different refractive indices arranged alternatingly in the multilayer structure is, for instance, suitable for the cold-light mirror.

It may also be advantageous to combine a dielectric mirror with a mirror metallization or a mirror alloy to form the mirror layer 14. For instance, a dielectric layer such as a layer of silicon dioxide, or a layer structure with a number of dielectric layers having different refractive indices, may be provided, and then a layer of metallization or of alloy, such as a layer containing Au, Ag or Al, may be applied to this layer. Dielectric layer structures feature a large dependency in their reflectivity on the angle of incidence with which the radiation meets the layer structure, whereas metal layers or alloy layers exhibit a high reflectivity that is largely independent of the angle of incidence. Radiation generated in the active region meeting a combination of this sort consisting of a dielectric mirror, e.g., a cold-light mirror, and a metal or alloy mirror may first meet the dielectric mirror and be reflected there. A part of the radiation that penetrates through the dielectric mirror can then be reflected at the metal or alloy mirror. High reflectivities can thus also be achieved with metal or alloy layers of relatively low reflectivity, since the dielectric mirror contributes to the total reflectivity of the mirror layer 14.

A reflectivity of the mirror layer 14 for the radiation generated in the active region 4 is preferably 80% or more, particularly preferably 90% or more, most preferably 95% or more, e.g., 96% or more.

By means of mirror coating of the component 1, it is possible to achieve that the radiation emerges through a defined output face of the component. The mirror layer 14 can direct radiation in the direction of this output face.

Side faces 15 of the semiconductor body 2 that delimit it laterally are preferably mirror-coated. If the mirror layer 14, as may be the case with a metallization, is electrically conductive, then an insulation material, e.g., the insulation layer 10, is preferably arranged between the mirror layer 14 and the semiconductor body 2 in order to avoid a short-circuit.

In addition, the surface 16 of the carrier 3 that faces the semiconductor body 2 and that is not covered by the semiconductor body is preferably mirror-coated. Furthermore, a side face 17 of the carrier 3 that delimits it laterally is preferably mirror-coated. The surface 18 of the carrier 3 that faces away from the semiconductor body 2 is also preferably mirror-coated.

By means of the mirror coating, the radiation in the component can be directed in the direction of an output face of the component. The radiation power on the output side, and therefore the radiant exitance from the component, is thus increased.

If the output face is a face of the carrier, then the carrier 3 is preferably mirror-coated on all sides except for the output face. The component is preferably mirror-coated on all sides, apart from the output face and the connection side. The mirror coating can "force" the output to occur through the output face.

By means of a reflector layer 72 in the contacts it is also possible to prevent radiation from emerging from the component 1 on the connection side. Radiation that meets the reflector layer is instead reflected back into the semiconductor body 2, and can be output from the component through the output face.

In the present case the output face 19 is formed by one of the side faces of the carrier 3. Apart from this face, the component is preferably mirror-coated on every side, particularly preferably over its full area. Radiation 20 can emerge from the component through the output face.

The component according to FIG. 1 is implemented as a laterally-emitting component (side-looker), which emits radiation through an output face 19 that runs transversally to the active region 4. The radiation 20 can, in particular, be output from the component parallel to the active region. Side-looker components are particularly suitable for backlighting display equipment, e.g., liquid crystal displays, or for coupling radiation into an optical fiber.

Since the connecting faces 70, 80, are located on a common side of the component 1, the degree of freedom in the selection of the non-mirror-coated output face is advantageously increased. The output face 19 can be formed simply by not applying a mirror layer to the desired face.

A further element can be applied to the output face 19 (not illustrated explicitly). A luminescence conversion layer, for instance, containing a conversion material, can be applied to the output face. This layer can absorb radiation that is generated in the active region 4 and convert it into radiation with a greater wavelength. The two types of radiation can be mixed, so that radiation having a mixed color, e.g., white light, can be radiated from the side of the component that faces away from the luminescent conversion layer. Suitable conversion materials are described, for instance, in document WO 98/12757 (U.S. Pat. No. 6,066,861), the entire disclosure content of which is explicitly incorporated into the present application. Alternatively, or in addition, an optical element such as a refractive element for the beam shaping, in particular, a lens, or a diffractive element can be located on the output face 19 and, in particular, applied to the component. A photonic crystal structure can, furthermore, be arranged on the output face.

A component 1 of this type can be manufactured in a composite, where a number of components of the same type can at the same time be obtained. Manufacture in a composite is therefore particularly economical.

A method appropriate for manufacture in a composite for the fabrication of a number of optoelectronic components is described in document WO 2005/081319 (U.S. equivalent Publication No. 2009/0065800), the entire disclosure content of which is hereby explicitly included by reference in the present patent application.

Unlike conventional opto-components that comprise a semiconductor chip for the generation of radiation that is mounted in a housing that supports the chip or on a leadframe, whereby the chips in these components are encapsulated for each component separately, not in a composite, the components described here can be manufactured entirely in a composite.

Subsequent encapsulation of the components in order to protect them after the components have been singularized from the composite can be dispensed with.

A protective encapsulation 40 may instead be provided in the composite. An encapsulation is suggested by a dotted line in FIG. 1. The semiconductor body 2 is advantageously embedded in the encapsulation. The encapsulation 40 is a part of the singularized component. The encapsulation 40 may have singularized outer faces 41. The encapsulation 40 preferably protects the active region 4 from destruction external influences such as moisture.

A molding compound such as BCB may be applied to the semiconductor body 2 for the encapsulation 40. This is advantageously then hardened. The hardened encapsulation is mechanically stable, and protects the active region effectively. The encapsulation 40 may encompass the semiconductor body 2. The semiconductor body 2 is preferably protected by the encapsulation 40 in cooperation with the carrier 3. The encapsulation 40 preferably extends along all the sides of the semiconductor body 2 that do not face the carrier 3; the connecting faces 70, 80 on the side of the encapsulation 40 that faces away from the semiconductor body 2 are preferably uncovered.

Nitride compound semiconductors are particularly resistant to external influences, which means that encapsulation of a nitride-based component can be dispensed with comparatively little risk.

Phosphide and arsenide compound semiconductors on the other hand are more sensitive, in particular if they contain Al, to moisture for instance. Providing an encapsulation for components whose semiconductor body contains one of these materials is therefore particularly advantageous.

The ratio of the area of the face covered by the semiconductor body 2, viewed in plan view on the connection side to the size of the total area over which the component 1, viewed in plan view extends on the connection side, can be greater than 0.2, preferably greater than 0.3, particularly preferably greater than 0.5, and most preferably greater than 0.7.

In order to facilitate the emission of radiation from the semiconductor body, and in particular the passage of radiation from the semiconductor body 2 into the carrier 3, the surface of the semiconductor body 2 that faces away from the connection side, in particular the surface of the semiconductor body 2 that faces the carrier, can have a surface structure 21 with raised areas and depressions. A structure of this type may, for instance, be achieved by roughening this surface of the semiconductor body, e.g., by etching or, in particular if the carrier is formed from the growth substrate, by the deliberate use of an uneven growth substrate. An uneven growth substrate can be purposefully used to cause dislocations to be formed in the epitaxial semiconductor layers grown on the substrate, and these dislocations can yield an uneven surface. A surface structure 21 of this kind is illustrated schematically in the highly simplified sectional view of FIG. 1D.

By a surface structure 21 of this kind, reflection, e.g., total reflection, at the interface between the semiconductor body and the carrier can be disturbed. It is therefore easier for radiation to pass from the semiconductor body 2 into the carrier 3. If, for instance, in the case of a nitride compound semiconductor body, a sapphire carrier, preferably fabricated from the growth substrate, is used, it has a lower refractive index than the nitride compound semiconductor material, which means that there is a risk of ongoing total reflection within the semiconductor body. This total reflection can be disturbed by the surface structure 21.

Preferably, the recess(es) 11 through which the second contact 8 extends is (are) formed inclined. An inclined form of this type is sketched schematically in the partial sectional view of FIG. 1E. The path of the radiation within the semiconductor body can be disturbed by reflection of radiation at the contact material located in the recess. The radiation power that passes from the semiconductor body into the carrier can be increased in this way. Preferably, the recess narrows as it extends from the connection side of the component in the direction of the side of the active region that faces away from the connection side. A shape of this type may, for instance, be achieved by forming the recess through dry etching using a suitably inclined mask.

The output face 19 preferably has raised areas and depressions. By means of a decoupling structure of this type, the radiation power emerging from the output face can be increased owing to the disturbance of the (total) reflection at the output face. A decoupling structure of this sort is suggested by dotted lines in FIGS. 1B and 1C.

Figure 2A:
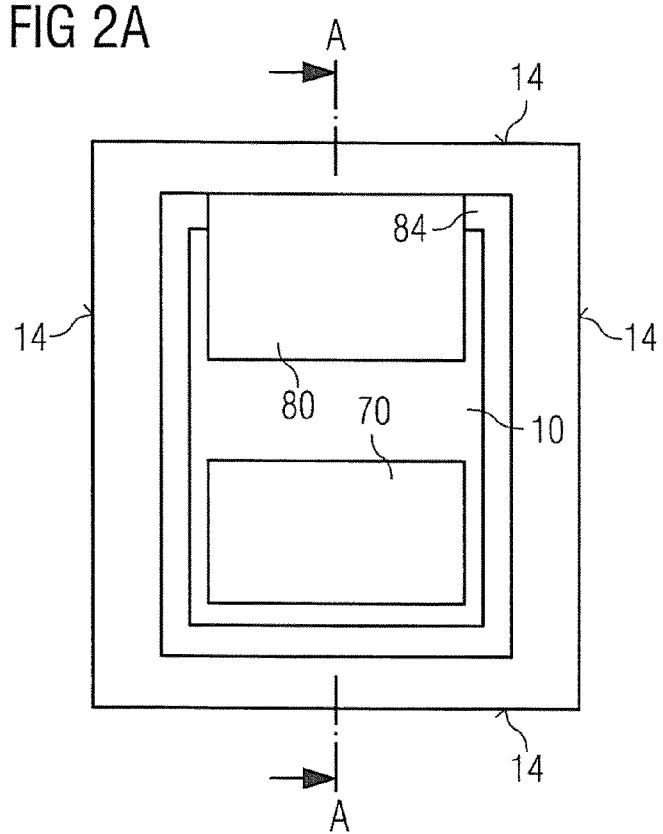
FIG. 2 shows a further exemplary embodiment of an optoelectronic component based on a schematic plan view in FIG. 2A and a schematic sectional view in FIG. 2B.
Figure 2B:
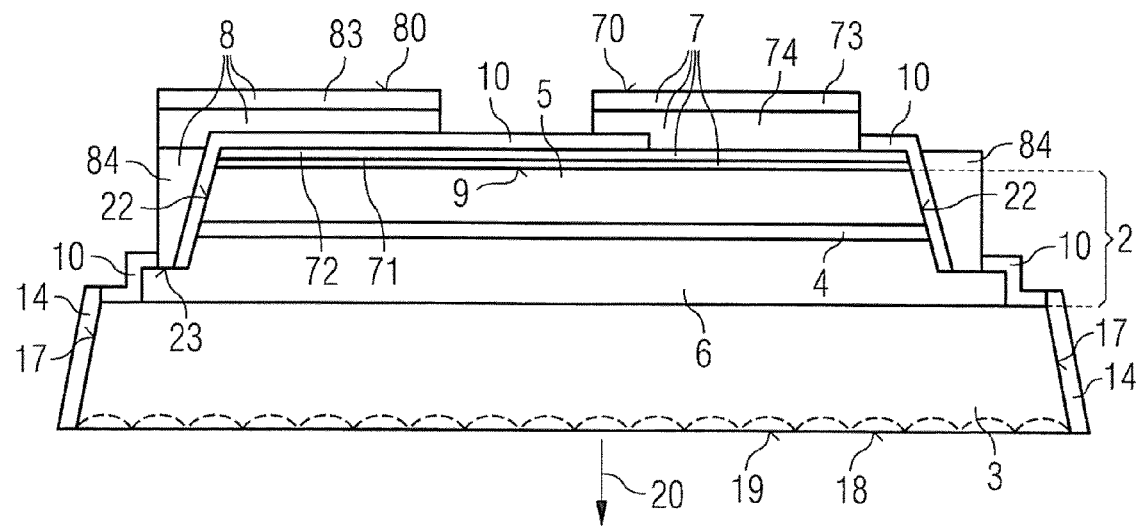

FIG. 2 shows a further exemplary embodiment of an optoelectronic component based on a schematic plan view in FIG. 2A and a schematic sectional view in FIG. 2B. The section in FIG. 2B here is taken along the line A-A in FIG. 2A. The exemplary embodiment according to FIG. 2 largely corresponds to the exemplary embodiment described in association with FIG. 1.

In contrast thereto, the electrical contact connection to the side of the semiconductor body that faces away from the connection side, in particular, the contact connection of region 6 of the semiconductor body 2, is made laterally next to a side face 22 that laterally delimits the semiconductor body 2. It is therefore possible to omit recesses and contact extensions according to the exemplary embodiment in FIG. 1, and in the same way also to omit a second insulation layer 13. The contact layer 71 and, preferably, the reflector layer 72 can thus be implemented as a continuous layer.

The second contact 8 extends next to a side face 22 of the semiconductor body that delimits the active region 4, starting from the connection side through to the side of the active region 4 that faces away from the connection side. The second contact 8 therefore preferably comprises a layer 84 extending next to the active region and beyond it, preferably deposited onto the insulation layer 10. This layer 84 has an electrical connection to the semiconductor body, in particular to the region 6, in a contact region 23 on the side of the active region 4 that faces away from the connecting face. Preferably the layer 84 surrounds the semiconductor body frame-like. In this way, a homogeneous injection of charge carriers over the active region 4 can be made easier in order to generate radiation over a wide area.

The side faces 22 of the semiconductor body are, moreover, implemented at an incline. The path of the radiation 20 within the semiconductor body can be disturbed through reflection at the surface of the layer 84 of the second contact 8 that faces towards the semiconductor body and that is oriented at an incline. In this way the radiation power entering into the carrier 3 can be increased.

In contrast to the exemplary embodiment according to FIG. 1, all the side faces 17 of the carrier 3 are mirror-coated, and, in particular, are provided with the mirror layer 14. The surface 18 of the carrier 3 that faces away from the semiconductor body 2 is implemented as an output face 19 with no mirror coating. The component is thus implemented as a top-looker. The output face 19 can have a surface structure, as is suggested by the dotted line. It is of course true that if the mirror coating is appropriately applied, the component according to FIG. 1 can be implemented as a top-looker, while the component according to FIG. 2 can be implemented as a side-looker.

Inclined side faces on the semiconductor body 2 and/or the carrier 3 corresponding to the illustration of FIG. 2 can of course also be given to the component according to FIG. 1.

The component 1 according to FIG. 2 can also be provided with encapsulation 40, as is suggested in FIGS. 1B and 1C. The side of the semiconductor body 2 that faces the carrier 3 may, furthermore, have a structure according to FIG. 1D.

The chip-like components according to FIGS. 1 and 2 are particularly suitable for backlighting display equipment, e.g., a liquid crystal display, or for injecting radiation into an optical fiber.

FIG. 3 shows an exemplary embodiment for a method for the manufacture of multiple optoelectronic components based on the intermediate steps schematically illustrated in FIGS. 3A to 3D.

Figure 3A:
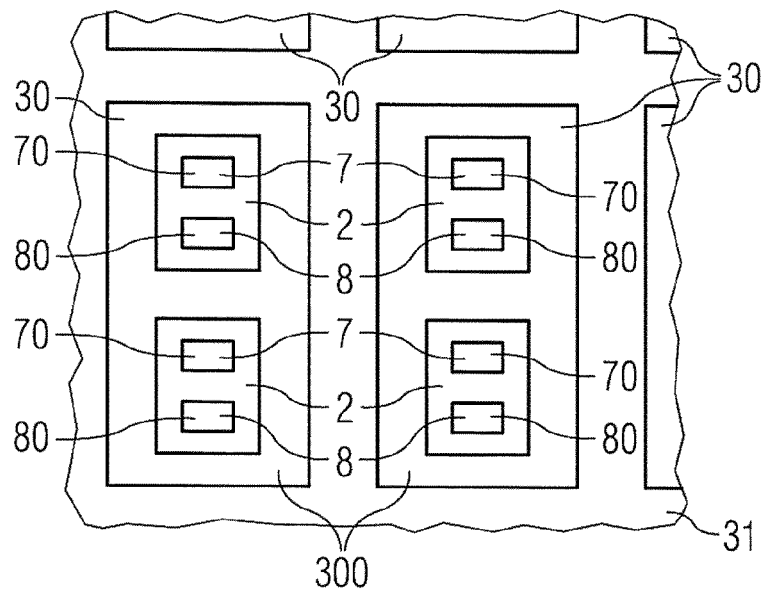
FIG. 3 shows an exemplary embodiment of a method for the manufacture of a plurality of optoelectronic components based on the intermediate steps illustrated in FIGS. 3A to 3D.

Initially, as is shown schematically in the view from above of FIG. 3A, a number of composite elements 30, in particular, composite elements of the same type, are provided. The composite elements 30 are arranged next to one another on an auxiliary carrier 31. In FIG. 3, only a portion of the arrangement of the composite elements 30 on the auxiliary carrier 31 is illustrated.

A single composite element here comprises a carrier layer 300. A number of semiconductor bodies 2 are arranged on each carrier layer 300. The semiconductor bodies are preferably constructed according to the semiconductor bodies described in association with FIGS. 1 and 2. In particular, a contact structure having two contacts 7, 8 insulated from one another on the connection side, and electrically conductively connected to the active region of the semiconductor body, are already provided. For reasons of clarity, neither the shape of the contact structure nor the active region is shown in more detail. The connecting faces 70 and 80 of the contacts 7 and 8 are located on the side of the semiconductor body 2 that faces away from the carrier layer 300.

The composite elements 30 can, for instance, be obtained by singularizing an initial composite. The initial composite can be formed by a semiconductor wafer that comprises a growth substrate, together with semiconductor layer structure grown epitaxially on this substrate. The semiconductor body 2 can be formed from the semiconductor layer structure. The contacts 7, 8 for the semiconductor body 2 may already be provided in the initial composite.

After the semiconductor bodies have been formed, and preferably after the formation of the contacts, the initial composition can be divided into the composite elements 30. If the carrier layer 300 differs from the growth substrate for the structure of semiconductor layers, then a layer for the carrier layers of the composite elements can first be applied to the initial composite, after which the growth substrate is released, and then singularized into composite elements 30 through the layer for the carrier layers. The composite of composite elements and auxiliary carrier is advantageously formed by singularizing the initial composite; the auxiliary carrier advantageously provides mechanical stability to this composite. A large number of composite elements 30, for instance 50 composite elements or more, or 100 composite elements or more, can be arranged on the auxiliary carrier 31.

The composite elements 30 preferably each comprise a number of semiconductor bodies 2 arranged adjacent to each other in one line. A composite element particularly preferably comprises exactly two semiconductor bodies.

The composite elements 30 are then mirror-coated. A protective layer 32 is preferably applied to partial regions of the composite element that are not immediately to be mirror-coated, e.g., the connection side of each semiconductor body 2, prior to application of the mirror layer. The protective layer 32 is preferably structured in such a way that those regions of the composite elements that are not to be directly mirror-coated are covered by the protective layer. A material that can be photographically patterned, such as a photo resist, is suitable for use as a protective layer of this type.

After the protective layer 32 has been applied, preferably covering all the exposed sections of the contacts 7 and 8, a mirror layer 140 can be applied to the composite elements 30. This mirror layer 140 is preferably deposited on the composite elements. The auxiliary carrier 31 can, at the same time, be mirror-coated in regions that are not occupied by composite elements 30. The application of the mirror layer is suggested by the arrows in FIG. 3B. The composite elements 30 are preferably mirror-coated over the full area on that sides which do not face the auxiliary carrier 31.

The auxiliary carrier 31 is preferably expandable in order to simplify mirror coating of the side faces of the composite elements 30. Prior to application of the mirror layer, the auxiliary carrier can be expanded, so that spaces between the neighboring composite elements are enlarged. These side faces of the composite elements can then more easily be covered with mirror layer material. The mirror layer can, for example, be implemented by a mirror metallization or as a cold-light mirror, or may comprise a mirror metallization and a cold-light mirror. An expandable foil is particularly suitable as an expandable auxiliary carrier. Expandable foils of this type can, for instance, be obtained as dicing tape from Hitachi.

Figure 3B:
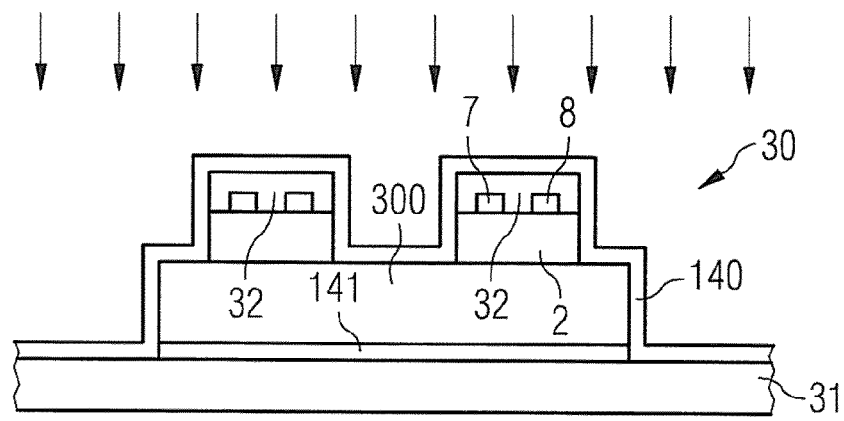

The side of the composite element 30 that faces the auxiliary carrier 31 and that is shadowed from the application of the mirror layer material to the composite element can be given a further mirror layer 141 at an earlier stage, e.g., when still in the initial composite. If the side of the carrier layer that faces away from the semiconductor body 2 is to be used to form the output face of the optoelectronic component that is to be manufactured, then it is possible to omit mirror coating of this face, and correspondingly to omit the further mirror layer 141. The structure that results after the composite element has been mirror-coated is illustrated in FIG. 3B through a schematic partial sectional view.

After this, the protective layer 32 can be removed again, together with that part of the mirror layer that is positioned on it. This again exposes the contacts 7 and 8. The protective layer 32 can be omitted if the connecting faces of the contacts face the auxiliary carrier 31 (not explicitly illustrated). The side that faces the auxiliary carrier is shadowed from the deposition of the mirror layer. In this way, mirror coating material can be prevented from directly reaching the contacts without the need of a special protective layer. The risk of a short-circuit is therefore reduced.

After this, the composite elements 30 can be singularized to form individual components 1. The individual components can be separated by separating the composite element in a region between two neighboring semiconductor bodies 2. Singularization can, for instance, be done along the line 33 in FIG. 3C. This cuts through the mirror layer 140. The carrier layer 300 is also cut through during the separation. In the separated region that is exposed after the mirror coating, the carrier 3 formed from the carrier layer 300 is not mirror-coated. A further mirror layer 141 located on the side of the carrier layer 300 that faces away from the semiconductor bodies 2, if present, is also separated. The detached components can be lifted off the auxiliary carrier 31.

The composite element, in particular the carrier layer 300, can, for instance, first be scored for the purposes of separation, for instance using a laser, and then broken in the scored area.

Figure 3C:
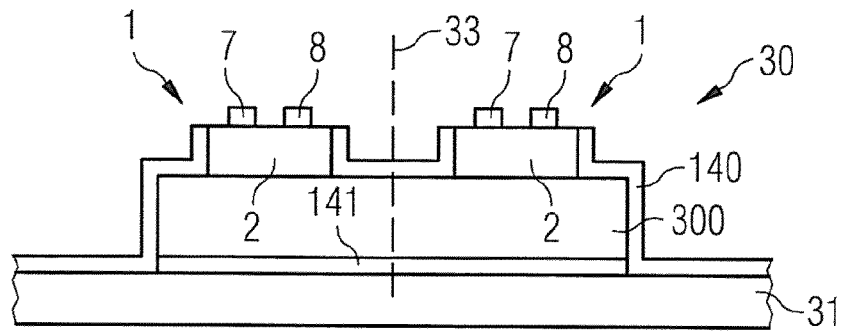
Figure 3D:
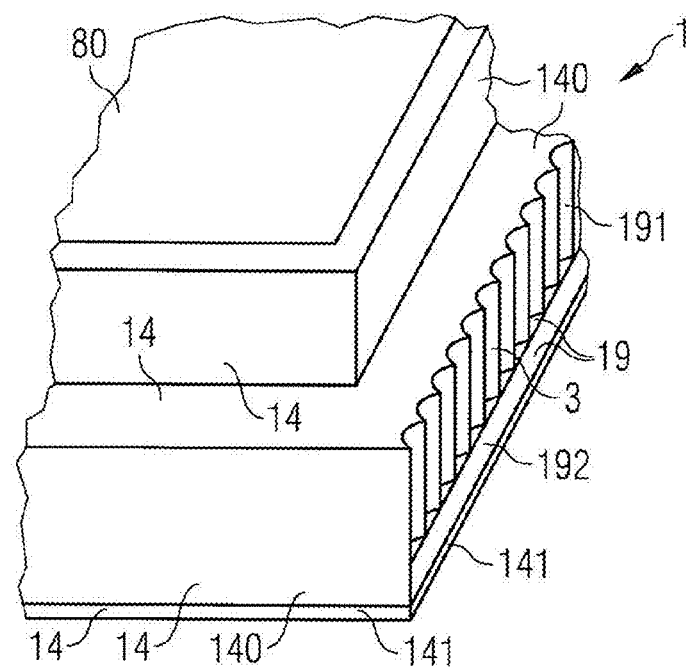

When a composite element 30 according to FIG. 3C is separated, two side-looker components are created with non-mirror-coated output faces that, in particular, face each other. The components 1 each have a singularized output face, and have the structure, for instance, shown in FIG. 1. A partial view from above of a component 1 after singularization is shown in FIG. 3D. If separation is done by scoring followed by breaking, then the output face, in particular on the side of the semiconductor body 2, has a structured region 191 and, in particular, in the region more distant from the semiconductor body, a region 192 that is smooth in comparison with the structured region and is preferably broken. This means that an output structure can be formed on the output face 19 at during singularization. The radiation power emitted from this face can be increased by means of the structure. The mirror coating 14 here includes parts of the mirror layers 141 and 140 that are obtained when the composite element 30 is separated.

The carrier 3 of the component 1 is formed from the carrier layer 300 during the singularization. Singularization of the composite element 30 thus simultaneously creates two laterally-emitting components (side-lookers), in particular components having output faces 19 that face one another.

If a surface-emitting component, in particular, a top-looker, is to be formed with the face of the carrier 3 that faces away from the semiconductor body 2 as the output face, then the further mirror coating layer 141 is advantageously omitted. A non-mirror-coated side face of the carrier 3 created during separation can, in some cases, be given a reflective coating for the top-looker—possibly involving expansion of the auxiliary carrier 31.

Alternatively, a component 1 can first be mirror-coated over its whole area on all sides, with the possible exception of a shielded side, and the mirror layer can later be removed from the face that is intended to form an output face. For clearing the face that is intended to be an output face, those regions of the composite element 30 that are designed to be the output faces can in some cases be given a further protective layer 34. A mirror layer can then be applied, and the mirror-coated protective layer 34 can then be removed, possibly together with the protective layer 32 that preferably covers the contacts 7 and 8. The output face can thereby be exposed. The composite element 30 can be separated before or after removal of the mirror-coated protective layer. The protective layer 32 can be omitted if the connecting faces of the contacts face the auxiliary carrier 31 (not explicitly illustrated). The side that faces the auxiliary carrier is shielded from the deposition of the mirror layer. In this way, mirror coating material can be prevented from directly reaching the contacts without the need of a special protective layer. The risk of a short-circuit is therefore reduced.

The protective layer 34 can be applied to the composite in a liquid state, and can be hardened after application, for instance thermally. The protective layer can, for instance, contain polyvinyl alcohol (PVA). A PVA protective layer can be hardened thermally. It is, furthermore, advantageous if a soluble, e.g., water-soluble, protective layer is used. The protective layer can then easily be rinsed off. PVA is water-soluble.

Figure 4A:
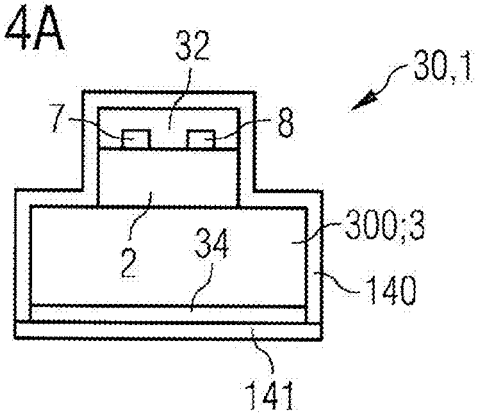
FIG. 4 shows a further exemplary embodiment of a method for the manufacture of a plurality of optoelectronic components based on the intermediate steps illustrated in FIGS. 4A and 4B.
Figure 4B:
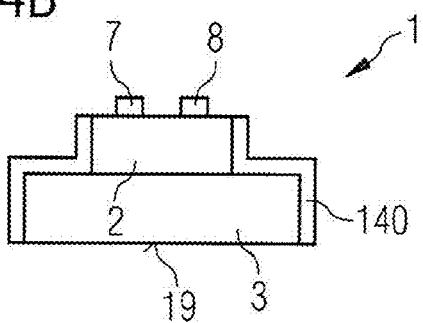

A method of this type is illustrated by means of the intermediate steps in the schematic sectional views in FIGS. 4A and 4B, where FIG. 4A illustrates the situation after mirror coating, while FIG. 4B illustrates the situation after removal of the mirror-coated protective layer(s). In this way, for example, a component according to FIG. 2 can be manufactured.

Figure 5:
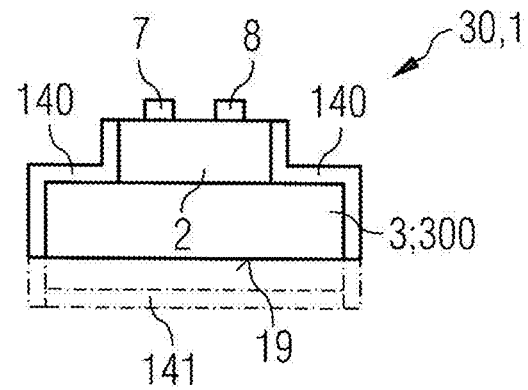
FIG. 5 schematically illustrates an intermediate step in a further exemplary embodiment of a method for the manufacture of a plurality of optoelectronic components.

As an alternative to the provision of the protective layer, the mirror layer can be mechanically removed from a mirror-coated output face. This is schematically suggested in FIG. 5. For this purpose, the carrier layer 300 of the composite element 30, or the carrier 3 of the already singularized components 1 can be ground on the side that faces away from the semiconductor body 2, as a result of which mirror coating 141 of the side of the carrier layer 300 or of the carrier 3 that faces away from semiconductor body is removed. In this process in particular, a part of the carrier 3 or of the carrier layer 300 may also be removed.

The carrier 3 of a component 1 can be thinned.

Figure 6:
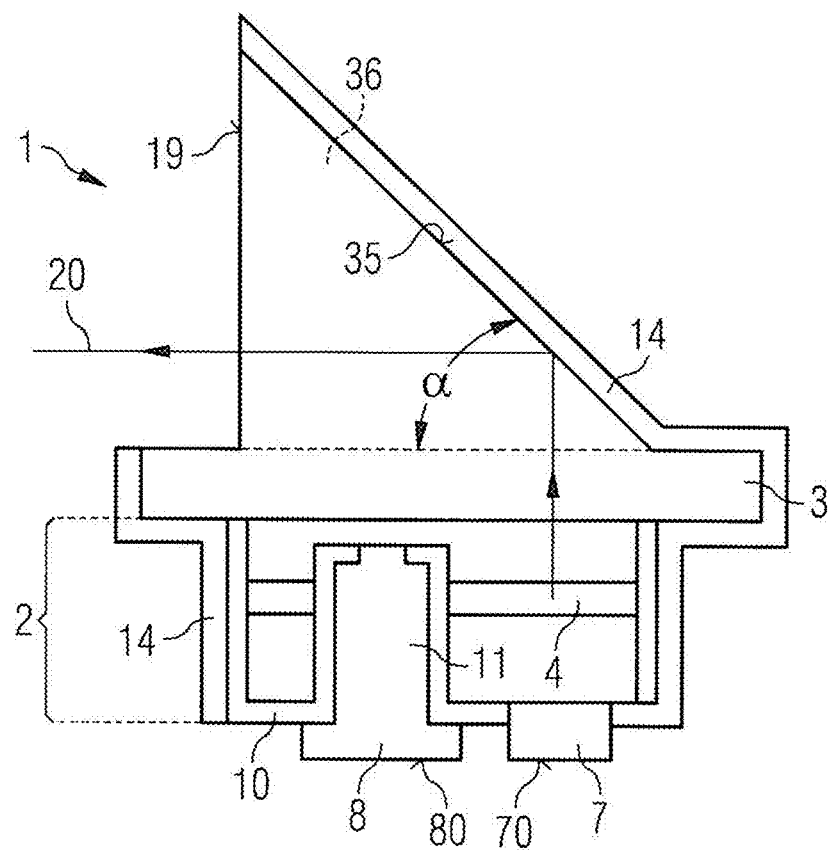
FIG. 6 shows a further exemplary embodiment of an optoelectronic component by means of a schematic sectional view.

FIG. 6 shows a further exemplary embodiment of an optoelectronic component 1 by means of a schematic sectional view. The component 1 is formed as a side-looker component. The component 1 corresponds substantially to the component described in association with FIG. 1; the contact layer can be omitted. A contact structure in accordance with FIG. 1 is nevertheless preferred, owing to the advantages described above, but is not illustrated explicitly in FIG. 6 for reasons of clarity. As an alternative it is also possible for the contact to the component to be implemented in accordance with the component as described in association with FIG. 2.

Unlike the components described above, the component in accordance with FIG. 6 comprises a reflector face 35 that extends, preferably completely, over the active region 4, and which runs obliquely, preferably at an acute angle α other than 90°, relative to the active region 4. An angle of 45° or less has been found to be particularly advantageous. The angle α is, for instance, 45°. Preferably the reflector face 35 is mirror-coated, and for this purpose has been coated with the mirror layer 14.

The reflective face 35 can be formed in the composite element through appropriate structuring of the carrier 3 or of the carrier layer 300. Alternatively, a partially reflective output window 36 that is transparent to radiation can be joined to the carrier 3. This is suggested by the dashed line. The output window 36 is preferably joined to the carrier 3 in a mechanically stable way, such as by gluing. Preferably here, a material employed for the output window 36 and/or an attachment layer between the carrier 3 and the output window 36 is one that remains stable under the influence of shortwave radiation, e.g., ultraviolet or blue radiation. The output window, for instance, contains a glass or polymer material such as BCB for this purpose.

The use of materials that are resistant to highly energetic radiation for the output window is particularly advantageous for a semiconductor body consisting of nitride compound semiconductor material in which highly energetic shortwave radiation, e.g., blue or ultraviolet, can be generated Radiation can be directed to the output face 19 by the inclined reflector face 35 in a targeted manner. A wedge-shaped body is particularly advantageous for the oblique reflector face 35. Accordingly, the carrier 3 may for instance be given a wedge-shaped structure in one area, or a wedge-shaped output window 36 may be used.

The output face 19 extends over the reflector face 35, preferably over the entire reflector face 35. The reflector face and the output face run at an angle relative to one another, particularly an angle other than 90°, e.g., 45°. Furthermore, the output face preferably runs perpendicularly to the active region 4.

Preferably, the inclined reflector face 35 is fabricated in the composite. A window composite with multiple preformed output window regions can be attached for this purpose to the composite elements, or may be already, provided in the initial composite.

It is also possible for the output window 36 to be attached directly to the semiconductor body 2. The carrier 3, e.g., the growth substrate, can accordingly be removed. The physical height of the component is accordingly reduced.

FIG. 7 shows a further exemplary embodiment of an optoelectronic component 1 by means of a schematic sectional view. The component 1 substantially corresponds to the component described in association with FIG. 1. In contrast, however, a carrier that mechanically stabilizes the semiconductor body 2 is omitted. The output face 19 of the component 1 extends over the active region 4, and runs transversely to the active region. The output face 19 can be located laterally adjacent to the side face 15 of the semiconductor body 2 that delimits the active region 4. The output face can, for example, be formed by the side of the insulation layer 10 that faces away from the semiconductor body. It is also possible for the side face 15 of the semiconductor body to directly form the output face. In this case, the semiconductor body is advantageously free from the insulation layer 10 on the side face 15.

The component illustrated in FIG. 7, a light-emitting diode for instance, does not comprise an element specially provided to stabilize the semiconductor body, which is preferably grown epitaxially. The carrier, 3, in particular, is dispensed with.

This carrier-less component is characterized by a particularly low height. The component consists of the semiconductor body 2, the contacts 7, 8 and of layers that are applied to these, in particular, deposited on them, and which layers preferably are not self-supporting.

The mirror layer 14 is applied, in particular directly, to the surface 24 of the semiconductor body 2 that faces away from the connecting faces of the contacts.

The component is covered with the mirror layer 14 with the exception of the output face 19 and the connection side. The reflection of radiation back into the semiconductor body 2 can be achieved through the reflector layer 72 of the contact 7 also on the side of the connecting faces 70, 80. A particularly high radiant exitance output is accordingly achieved on the side of the output face 19.

Apart from the output face, all the surfaces of the component are provided with a reflection element, the mirror coating 14 or the reflector layer 72.

A carrier-less component of this type can, of course, not only be implemented as a side-looker, as illustrated, but can also be implemented as a top-looker component with appropriate design of the mirror coating. In this case a surface of the semiconductor body that faces away from the connecting faces 70, 80 of the contacts 7, 8, in particular the surface 24, remains partially or wholly without mirror coating. The side face 15 of the semiconductor body in FIG. 7 with no mirror coating is in this case preferably provided with a mirror layer (not shown explicitly). For a top-looker, the surface 24 of the semiconductor body is preferably given a surface structure 21, for instance a surface structure as illustrated in FIG. 1D.

A carrier 3 or a carrier layer 300, can be provided as a temporary intermediate support during the manufacture of a carrier-less component 1 of this type, in particular, one without a growth substrate. The carrier 3, or the carrier layer 300, is however removed during the process of manufacture. Preferably the carrier 3 or the carrier layer 300 is removed entirely.

It is particularly advantageous in the manufacture of a carrier-less component of this type for composite elements 30, as described further above, or parts that have already been singularized from the composite elements, to be arranged on the auxiliary carrier 31 in such a way that the connecting faces 70, 80 of the contacts are facing the auxiliary carrier 31. After this, the carrier layer 300, or a carrier 3 that has already been singularized, can be removed from the semiconductor bodies 2 by, for instance, a laser-supported process. After removal, mirror coating can be applied over all the faces, with the exception of the shadowed side. It is preferred here for an output face of the component that is to be manufactured and that is not immediately to be mirror-coated to be covered with a suitable protective layer that will be removed again from the component after the mirror coating, together with the mirror layer which was applied to the protective layer, so creating an output face.

The other components described further above and below can also, if required, be implemented as carrier-less components.

FIG. 8 shows a further exemplary embodiment of an optoelectronic component 1 by means of a schematic sectional view. The component substantially corresponds to the component described in association with FIG. 6. In particular, the component comprises a reflector face 35 that extends at an angle to the active region 4. This can be provided in a special output window 36 or the carrier 3. In contrast to the component described in FIG. 6, the carrier 3, or the output window 36, on the side that faces away from the semiconductor body 2 is flattened in a partial region 37. This region 37 is advantageously mirror-coated. The partial region 37 runs preferably parallel to the active region.

The reflector face 35 preferably extends starting from the flattened partial region 37 at an angle to the active region in the direction of the semiconductor body. The reflector face 35 is preferably oriented at an angle to the surface 24 of the semiconductor body 2 that faces away from the connecting faces 70, 80 of the contacts 7, 8. The reflector face 35, in particular, only extends partially over the active region 4.

Advantageously, compared to the component of FIG. 6, for a given angle α, the physical height of the component, in other words the dimension of the component from the connecting faces of the component to the side of the component that faces away from the connecting faces, is reduced.

Even with a reflector face 35 that only extends partially over the active region, radiation can be efficiently directed towards the output face 19.

Figure 9:
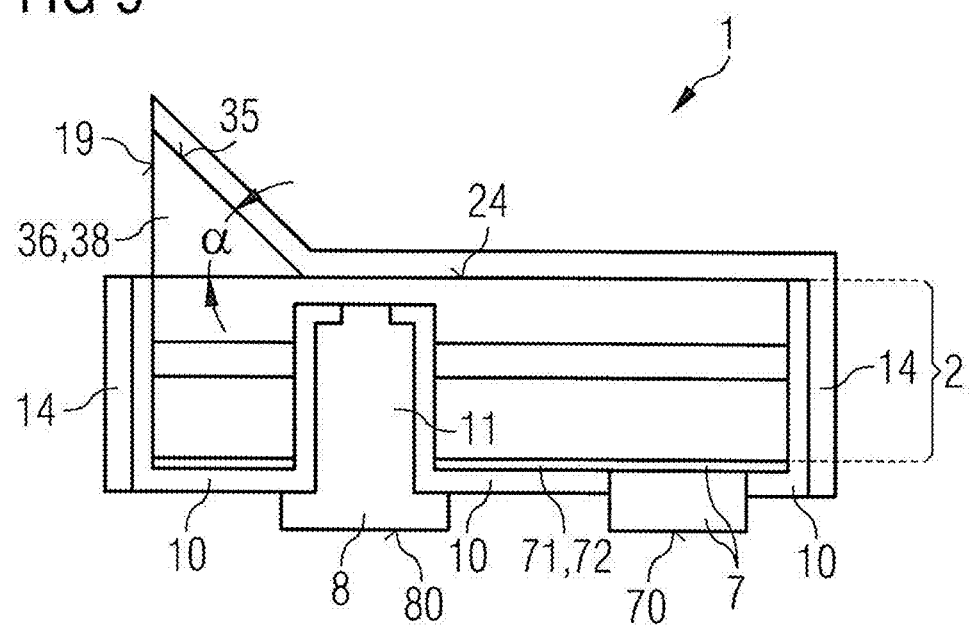
FIG. 9 shows a further exemplary embodiment of an optoelectronic component by means of a schematic sectional view.

FIG. 9 shows a further exemplary embodiment of an optoelectronic component 1 by means of a schematic sectional view. This component corresponds largely to the components described in association with FIGS. 6 and 8. Like the component illustrated in FIG. 8, the reflector face 35 extends only partly over the active region. Unlike FIG. 8, a partial region of the surface 24 of the semiconductor body 2 that faces towards the output window 36 is not provided with the output window. This free surface 24 is preferably coated with the mirror layer 14. Advantageously the mirror layer 14 is applied on this surface directly to the semiconductor body, or to an insulation material that has been applied to the semiconductor body. The reflector face 35 is also coated with the mirror layer 14. Just as in the case of the flattened region 37 in FIG. 8, a laterally narrowed output window 36, preferably having the shape of a wedge or cone, extending over only a part of the active region, achieves a reduction in the physical height of the component for a given angle α, e.g., 45°.

The output window and/or the output face can be narrower than the semiconductor body along a transverse dimension of the semiconductor body, e.g., the width of the semiconductor body 2, and/or along a longitudinal dimension of the semiconductor body 2, e.g., the length of the semiconductor body. A point-radiator, for instance, can be formed by small dimensions of this type.

The output window 36 can be applied as a separate window to the semiconductor body, which is preferably free from the carrier 3 or from the carrier layer 300, or may be formed as a carrier piece 38, i.e., as a piece fabricated from the carrier 3. The output window 36 is preferably formed in the composite.

By means of the mirror coating of the surface of the semiconductor body that faces the output window, radiation can be guided to the output face in spite of the small output window, so that high radiant exitance can be achieved.

The invention is not restricted to the description that refers to the exemplary embodiments. Rather, the invention comprises each new feature, as well as any combination of features, and that includes in particular every combination of features in the patent claims, even if this feature or this combination itself is not explicitly described in the patent claims or exemplary embodiments.

The invention claimed is:

1. An optoelectronic component comprising:
   a semiconductor body that comprises an active region suitable for generating radiation, and
   two electrical contacts arranged on the semiconductor body, wherein the contacts are electrically conductively connected to the active region and the contacts each have a connecting face that faces away from the semiconductor body, the connecting faces both being located on a connection side of the component,
   wherein a side of the component that is different from the connection side is coated with a mirror coating,
   wherein the component is configured as a laterally emitting component, and
   wherein an output face of the component comprises raised areas and depressions and runs transversally to the active region.

2. The component according to claim 1, wherein the mirror coating comprises an electrically conductive mirror layer and a dielectric mirror layer.

3. The component according to claim 1, wherein a mirror-coated face of the component that runs obliquely with respect to the active region extends over the active region.

4. The component according to claim 1, wherein the component is implemented as a surface-mountable component.

5. A method for the manufacture of a plurality of optoelectronic components, the method comprising:
   providing a composite element with a carrier layer and a plurality of semiconductor bodies arranged on the carrier layer, each semiconductor body comprising an active region suitable for the generation of radiation;
   applying a mirror layer to the composite element; and
   singularizing the composite element into the plurality of optoelectronic components, each optoelectronic component comprising:
      a semiconductor body of the plurality of semiconductor bodies, and
      two electrical contacts arranged on the semiconductor body, wherein the contacts are electrically conductively connected to the active region and the contacts each have a connecting face that faces away from the semiconductor body, the connecting faces being located on a connection side of the optoelectronic component, wherein a side of the component that is different from the connection side is coated with the mirror coating, wherein the component is configured as a laterally emitting component, and wherein an output face of the component comprises raised areas and depressions and runs transversally to the active region.

6. The method according to claim 5, further comprising:
   applying a protective layer to parts of the composite element prior to applying the mirror layer, and
   removing the protective layer after applying the mirror layer.

7. The method according to claim 5, wherein a face of the composite element intended to form the output face is at first mirror-coated, and the mirror layer is removed at least in an area to form the output face.

8. The method according to claim 7, wherein the protective layer is applied to the face of the composite element that is intended to form the output face, the protective layer is mirror-coated, and the mirror-coated protective layer is subsequently removed.

9. The method according to claim 5, wherein a side of the composite element provided to form the output face is shadowed while the mirror layer is applied.

10. The method according to claim 5, wherein the output face of one of the components is created while singularizing the composite element.

11. The method according to claim 10, wherein depressions are formed in the output face while singularizing the composite element.

12. The method according to claim 5, wherein the mirror layer is cut through when singularizing the composite element.

13. The method according to claim 5, wherein applying the mirror layer comprises depositing the mirror layer onto the composite element.

\* \* \* \* \*

UNITED STATES PATENT AND TRADEMARK OFFICE
CERTIFICATE OF CORRECTION

PATENT NO.        : 8,476,644 B2
APPLICATION NO.   : 12/597682
DATED             : July 2, 2013
INVENTOR(S)       : Illek et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 335 days.

Signed and Sealed this
Eighth Day of September, 2015

Michelle K. Lee
*Director of the United States Patent and Trademark Office*